(12) United States Patent
Lee et al.

(10) Patent No.: US 11,989,422 B2
(45) Date of Patent: May 21, 2024

(54) MEMORY DEVICE, ELECTRONIC DEVICE AND OPERATING METHOD OF MEMORY DEVICE

(71) Applicant: SAMSUNG ELECTRONICS CO., LTD., Suwon-si (KR)

(72) Inventors: Changjun Lee, Seoul (KR); Youngmin Lee, Seoul (KR); Eunkak Kim, Seoul (KR); Jeongmin Seo, Hwaseongi-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 83 days.

(21) Appl. No.: 17/733,559

(22) Filed: Apr. 29, 2022

(65) Prior Publication Data

US 2023/0126954 A1    Apr. 27, 2023

(30) Foreign Application Priority Data

Oct. 21, 2021   (KR) .................. 10-2021-0141366

(51) Int. Cl.
  *G06F 3/06*    (2006.01)
(52) U.S. Cl.
  CPC .......... *G06F 3/0619* (2013.01); *G06F 3/0659* (2013.01); *G06F 3/0673* (2013.01)
(58) Field of Classification Search
  CPC ..... G06F 3/0619; G06F 3/0659; G06F 3/0673
  See application file for complete search history.

(56) References Cited

U.S. PATENT DOCUMENTS 5,195,098 A * 3/1993 Johnson .................... H04L 1/22
                                                    340/12.34
5,761,220 A * 6/1998 Zook ................... G06F 11/1008
                                                    714/767

(Continued)

FOREIGN PATENT DOCUMENTS

KR          10-0259297 B1    6/2000
KR        10-2008-0046973 A  5/2008

(Continued)

OTHER PUBLICATIONS

Communication dated Feb. 16, 2022 by the Korean Intellectual Property Office in counterpart Korean Patent Application No. 10-2021-0141366.

(Continued)

*Primary Examiner* — Ryan Bertram
(74) *Attorney, Agent, or Firm* — Sughrue Mion, PLLC

(57) ABSTRACT

A memory device, an electronic device, and a method of operating the memory device are provided. The memory device includes: a volatile memory including a plurality of memory cells, a plurality of word lines and a plurality of bit lines, and configured to provide output data stored in target memory cells, among the plurality of memory cells, based on a first read command and an address received from a host; a recovery logic circuit configured to provide hint data indicating first bit lines to which defective cells are connected, and second bit lines to which normal cells are connected, among the plurality of bit lines; and an Error Correction Circuit (ECC) configured to generate corrected data by correcting an error in the output data based on the output data and the hint data, and to provide the corrected data to the host.

20 Claims, 21 Drawing Sheets

(56) References Cited

U.S. PATENT DOCUMENTS

| | | | |
|---|---|---|---|
| 7,171,591 B2 | 1/2007 | Chen | |
| 7,581,154 B2 | 8/2009 | Rai et al. | |
| 8,069,389 B2* | 11/2011 | Yim | G06F 11/1008 |
| | | | 714/757 |
| 8,316,280 B2 | 11/2012 | Chang et al. | |
| 9,262,263 B2* | 2/2016 | Kim | G06F 11/102 |
| 9,484,114 B1* | 11/2016 | Ben-Rubi | G11C 7/00 |
| 9,626,244 B2 | 4/2017 | Sohn et al. | |
| 9,886,340 B2 | 2/2018 | Ahn et al. | |
| 10,884,848 B2 | 1/2021 | Chung et al. | |
| 10,884,940 B2 | 1/2021 | Kalamatianos et al. | |
| 11,106,535 B2 | 8/2021 | Cho et al. | |
| 11,163,640 B2 | 11/2021 | Eun et al. | |
| 2009/0183053 A1* | 7/2009 | Ito | G11C 11/4096 |
| | | | 714/764 |
| 2013/0315397 A1* | 11/2013 | Tuers | G06F 11/1012 |
| | | | 380/287 |
| 2014/0157087 A1* | 6/2014 | Yurzola | G06F 11/1012 |
| | | | 714/773 |
| 2014/0164874 A1* | 6/2014 | Franceschini | G06F 11/10 |
| | | | 714/764 |
| 2016/0322990 A1* | 11/2016 | Tuers | H03M 13/2909 |
| 2017/0091028 A1* | 3/2017 | Golan | G06F 11/1072 |
| 2017/0161144 A1* | 6/2017 | Reed | G06F 11/106 |
| 2017/0163291 A1* | 6/2017 | La Rosa | G11C 29/82 |
| 2019/0081640 A1* | 3/2019 | Motwani | H03M 13/611 |
| 2020/0401475 A1 | 12/2020 | Lu | |
| 2021/0027830 A1 | 1/2021 | Kim et al. | |
| 2021/0065835 A1* | 3/2021 | Jung | G11C 11/4085 |
| 2021/0265003 A1 | 8/2021 | Lee | |
| 2022/0229726 A1* | 7/2022 | Doh | G06F 11/1076 |
| 2023/0060621 A1* | 3/2023 | Chiang | G11C 29/42 |

FOREIGN PATENT DOCUMENTS

| | | |
|---|---|---|
| KR | 10-0833600 B1 | 5/2008 |
| KR | 10-1543245 B1 | 8/2015 |
| KR | 10-1704682 B1 | 2/2017 |
| KR | 10-1862379 B1 | 7/2018 |
| KR | 10-2019-0129653 A | 11/2019 |
| KR | 10-2021-0012177 A | 2/2021 |
| KR | 10-2021-0026201 A | 3/2021 |
| KR | 10-2021-0026487 A | 3/2021 |
| KR | 10-2021-0092391 A | 7/2021 |
| KR | 10-2021-0109085 A | 9/2021 |

OTHER PUBLICATIONS

European Search Report, dated Dec. 12, 2022, issued by the European Patent Office, Application No. 22176963.1.

* cited by examiner

FIG. 9A

Hint table

| BL No. | 0 | 1 | 2 | 3 | 4 | 5 | 6 | ... | 70 | 71 | 72 | ... | 130 | 131 | 132 | 133 | 134 | 135 |
|---|---|---|---|---|---|---|---|---|---|---|---|---|---|---|---|---|---|---|
| SEG | 0 | 0 | 0 | 0 | 0 | 0 | 1 | ... | 0 | 1 | 0 | ... | 0 | 0 | 0 | 0 | 0 | 0 |

FIG. 9B

Hint table

| BL No. | 0 | 1 | 2 | 3 | 4 | 5 | 6 | ... | 70 | 71 | 72 | ... | 130 | 131 | 132 | 133 | 134 | 135 |
|---|---|---|---|---|---|---|---|---|---|---|---|---|---|---|---|---|---|---|
| SEG | 0 | 0 | 0 | 0 | 0 | 0 | 0 | ... | 0 | 1 | 0 | ... | 0 | 0 | 0 | 0 | 0 | 0 |

FIG. 9C

Hint table

| BL No. | 0 | 1 | 2 | 3 | 4 | 5 | 6 | ... | 70 | 71 | 72 | ... | 130 | 131 | 132 | 133 | 134 | 135 |
|---|---|---|---|---|---|---|---|---|---|---|---|---|---|---|---|---|---|---|
| SEG | 0 | 0 | 0 | 0 | 0 | 0 | 1 | ... | 0 | 0 | 0 | ... | 0 | 0 | 0 | 0 | 0 | 0 |

FIG. 14

| Shmoo condition | | Clock frequency | | | | |
|---|---|---|---|---|---|---|
| | | CF1 | CF2 | CF3 | CF4 | CF5 |
| Internal voltage | IV5 | Pass | Pass | Pass | Pass | Pass |
| | IV4 | Pass | Pass | Pass | Pass | Fail |
| | IV3 | Pass | Pass | Pass | Fail | Fail |
| | IV2 | Pass | Pass | Fail | Fail | Fail |
| | IV1 | Pass | Fail | Fail | Fail | Fail |

FIG. 15

| | Address | 0 | 4 | 8 | C |
|---|---|---|---|---|---|
| (k−1)th SEG | 60347F50 | FFFFFFFF | FFFFFFFF | FFFFFFFF | FFFFFFFF |
| | ⋮ | FFFFFFFF | FFFFFFFF | FFFFFFFF | FFFFFFFF |
| | 60347FF0 | FFFFFFFF | FFFFFFFF | FFFFFFFF | FFFFFFFF |
| (k)th SEG | 60348000 | FFF7EFFF | FFFFFFFF | FFFFFFFF | FFFFFFFF |
| | 60348010 | FFF7EFFF | FFFFFFFF | FFFFFFFF | FFFFFFFF |
| | ⋮ | FFF7EFFF | FFFFFFFF | FFFFFFFF | FFFFFFFF |
| | 6034FFE0 | FFF7EFFF | FFFFFFFF | FFFFFFFF | FFFFFFFF |
| | 6034FFF0 | FFF7EFFF | FFFFFFFF | FFFFFFFF | FFFFFFFF |
| (k+1)th SEG | 60350000 | FFFFFFFF | FFFFFFFF | FFFFFFFF | FFFFFFFF |
| | ⋮ | FFFFFFFF | FFFFFFFF | FFFFFFFF | FFFFFFFF |
| | 603500A0 | FFFFFFFF | FFFFFFFF | FFFFFFFF | FFFFFFFF |

FIG. 16

Hint table

| BL No. | 0 | 1 | 2 | 3 | 4 | 5 | 6 | ... | 70 | 71 | 72 | ... | 130 | 131 | 132 | 133 | 134 | 135 |
|---|---|---|---|---|---|---|---|---|---|---|---|---|---|---|---|---|---|---|
| ... | | | | | | | | | | | | | | | | | | |
| (K-1)th SEG | 0 | 0 | 0 | 0 | 0 | 0 | 0 | ... | 0 | 0 | 0 | ... | 0 | 0 | 0 | 0 | 0 | 0 |
| (K)th SEG | 0 | 0 | 0 | 0 | 0 | 0 | 1 | ... | 0 | 1 | 0 | ... | 0 | 0 | 0 | 0 | 0 | 0 |
| (K+1)th SEG | 0 | 0 | 1 | 0 | 0 | 0 | 0 | ... | 0 | 0 | 0 | ... | 0 | 0 | 0 | 0 | 0 | 0 |
| ... | | | | | | | | | | | | | | | | | | |

MEMORY DEVICE, ELECTRONIC DEVICE AND OPERATING METHOD OF MEMORY DEVICE

CROSS-REFERENCE TO RELATED APPLICATION

This application claims priority to Korean Patent Application No. 10-2021-0141366, filed on Oct. 21, 2021, in the Korean Intellectual Property Office, the disclosure of which is incorporated by reference herein in its entirety.

BACKGROUND

The present disclosure relates to an electronic device, and more particularly, to a memory device, an electronic device, and an operating method of the memory device.

A semiconductor memory device may be categorized as a nonvolatile memory device, such as a flash memory device, or a volatile memory device such as DRAM. Volatile memory devices, such as DRAM, may be used as system memory and may be relatively inexpensive. In addition, in a volatile semiconductor memory device such as DRAM, the process scale is reduced to increase the degree of integration. As the process scale is reduced, the bit error rate may increase and the yield may decrease. Accordingly, there is a need for a method of checking and correcting a response to an error of a semiconductor memory device at low cost.

SUMMARY

One or more embodiments provide a memory device, an electronic device, and an operating method of the memory device capable of correcting a 2-bit error based on a 1-bit error.

According to an aspect of an example embodiment, a memory device includes: a volatile memory including a plurality of memory cells, a plurality of word lines and a plurality of bit lines, and configured to provide output data stored in target memory cells, among the plurality of memory cells, based on a first read command and an address received from a host; a recovery logic circuit configured to provide hint data indicating first bit lines to which defective cells are connected, and second bit lines to which normal cells are connected, among the plurality of bit lines; and an Error Correction Circuit (ECC) configured to generate corrected data by correcting an error in the output data based on the output data and the hint data, and to provide the corrected data to the host.

According to an aspect of an example embodiment, an electronic device includes: an application processor configured to output a first read command and an address; a buffer including a plurality of volatile memories, a multiplexer configured to select a volatile memory corresponding to the address from among the plurality of volatile memories, and an ECC configured to correct an error occurring in output data read from the volatile memory through a read operation performed according to the first read command; and a recovery logic circuit configured to provide hint data indicating first bit lines to which bad cells are respectively connected and second bit lines to which normal cells are connected. The ECC is further configured to correct the error based on first hint data corresponding to the selected volatile memory and the output data, and provide corrected data to the application processor.

According to an aspect of an example embodiment, a method of operating a memory device includes: receiving a read command and an address received from a host; reading data stored in a volatile memory corresponding to the address among a plurality of volatile memories; detecting a 2-bit error in the data read from the volatile memory; correcting the 2-bit error based on hint data corresponding to the volatile memory and the data read from the volatile memory to obtain corrected data; and providing the corrected data to the host.

According to an aspect of an example embodiment, a memory device includes: a volatile memory including a plurality of memory cells, a plurality of word lines and a plurality of bit lines; a recovery logic circuit configured to provide hint data; and an ECC configured to request the recovery logic circuit to generate the hint data based on a 2-bit error occurring in data read from the volatile memory, and correct an error of the data read from the volatile memory based on the hint data provided from the recovery logic circuit. The hint data has a first value to indicate first bit lines to which defective cells in which an error of 2 bits occur are connected, and a second value to indicate second bit lines to which normal cells are connected, among the plurality of bit lines. The recovery logic circuit is further configured to: transfer a first write command, first test pattern data, and an address to the volatile memory, and transfers a second read command and the address to the volatile memory to temporarily store the first test data output from the volatile memory; transfer a second write command, second test pattern data, and the address to the volatile memory, and transfers a third read command and the address to the volatile memory to temporarily store second test data output from the volatile memory; perform an XOR operation on the first test data and the second test data; and temporarily store result data having at least one first value as the hint data as a result of the XOR operation.

BRIEF DESCRIPTION OF THE DRAWINGS

The above and other aspects will be more apparent from the following description of embodiments taken in conjunction with the accompanying drawings, in which:

FIGS. 9A, 9B and 9C are diagrams for explaining hint data according to an embodiment;

FIG. 14 is a diagram illustrating an error tendency generated according to an internal voltage and a frequency of a clock using a Shmoo condition;

FIG. 15 is a diagram for explaining an error phenomenon that may occur in an address of each segment;

FIG. 16 is a diagram for explaining hint data according to another embodiment.

DETAILED DESCRIPTION

Hereinafter, embodiments will be described in detail with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
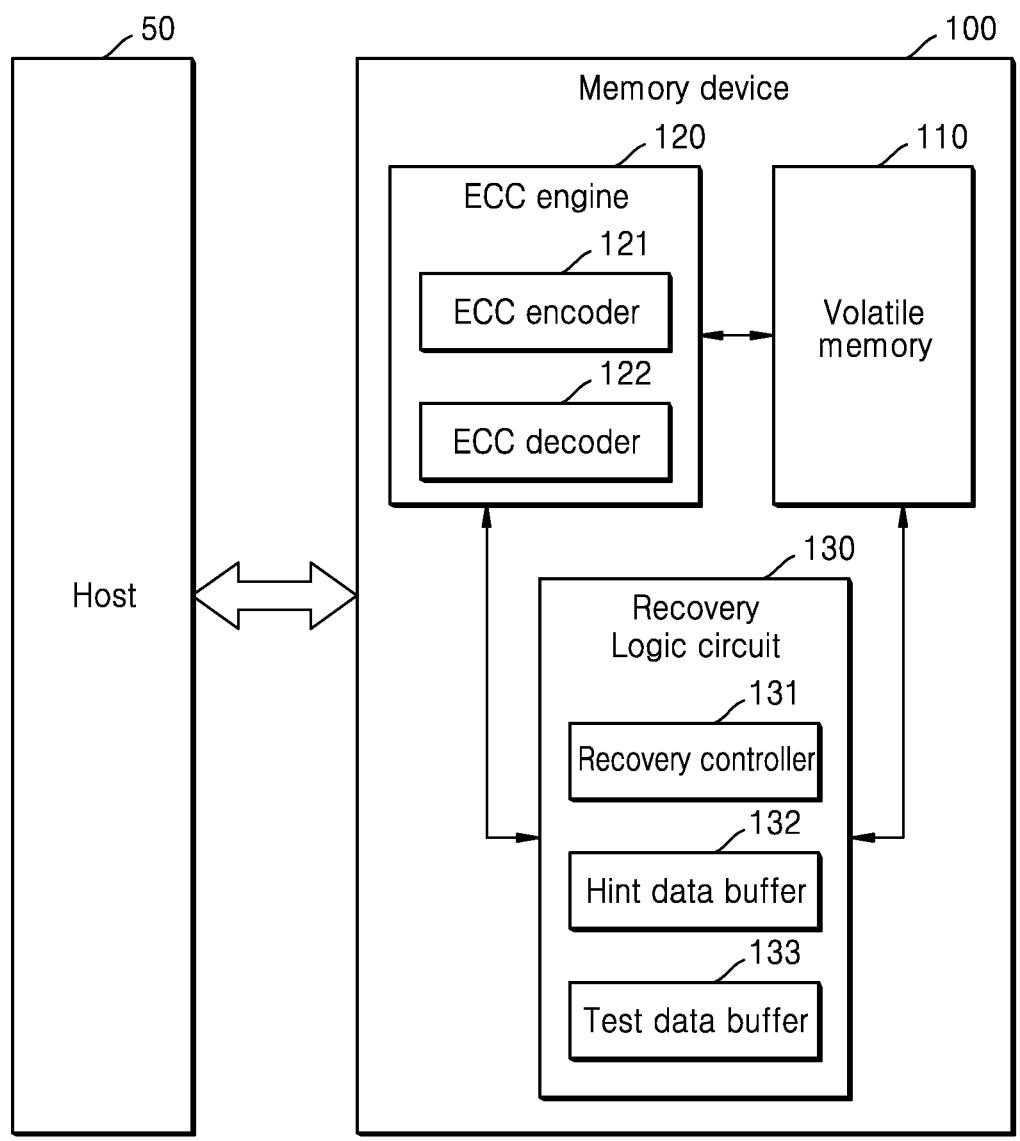
FIG. 1 is a diagram for describing an electronic device according to an embodiment.

FIG. 1 is a diagram for describing an electronic device according to an embodiment.

Referring to FIG. 1, an electronic device according to an embodiment may include a host 50 and a memory device 100.

The host 50 may be a device capable of processing data, such as a central processing unit (CPU), a processor, a microprocessor, or an application processor (AP). The host 50 may execute an operating system (OS) and/or various applications. For example, the electronic device according to an embodiment may be implemented as a mobile device, and in this case, the host 50 may be implemented as an AP or a system-on-a-chip (SoC). Accordingly, the host 50 may be embedded in the mobile device.

The host 50 may transmit a request signal to the memory device 100 and receive a response signal to the command from the memory device 100. For example, the request signal may request the memory device 100 perform a particular operation. For example, the host 50 may transmit a read request signal and an address to the memory device 100, and the memory device 100 may receive the read request signal and the address, and read data stored in a memory area corresponding to the address. The read request signal is a signal for requesting to read data stored in the memory device 100 and may be referred to as a read command. As another example, the host 50 may transmit a write request signal, data, and an address to the memory device 100, and the memory device 100 may receive the write request signal, the data and the address, and store the data in a memory area corresponding to the address. The write request signal is a signal that requests to store data in the memory device 100 and may be referred to as a write command.

The host 50 may provide an internal voltage and a clock for driving the memory device 100 to the memory device 100.

The memory device 100 may store data or read stored data in response to a request signal from the host 50. The memory device 100 may include a plurality of components. A component may be implemented in the memory device 100 in a hardware form, in a software form, or in a hardware and software form. A component in the hardware form includes circuitry such as transistors, capacitors, logic gates, and other circuit elements to implement certain functionality described in more detail below. A component in this specification may be referred to as an element. Referring to FIG. 1, for example, the memory device 100 may include a volatile memory 110, an error correction code (ECC) engine 120 (or referred as error correction circuit), and a recovery logic circuit 130.

The volatile memory 110 may operate only while receiving power. The volatile memory 110 may temporarily store data provided from the host 50 or provide stored data to the host 50 only while power is supplied. The volatile memory 110 may operate as a buffer memory. For example, the volatile memory 110 may be implemented as a dynamic random-access memory (DRAM) or a static random-access memory (SRAM). However, embodiments are not limited thereto.

In one embodiment, in response to the test control signal output from the recovery logic circuit 130, the volatile memory 110 may write first test pattern data to memory cells connected to the target word line, read the first test data stored in the memory cells connected to the target word line, write second test pattern data to memory cells connected to the target word line, and read the second test data stored in memory cells connected to the target word line. The target word line may be a word line of a bad cell which generates an error during a read operation.

The ECC engine 120 may perform an ECC operation on data stored in the volatile memory 110. In an embodiment, the ECC engine 120 may generate a parity bit for data received from the host 50, and transmit a codeword including the data and the parity bit to the volatile memory 110. The ECC engine 120 may correct an error of one bit included in one unit (e.g., one codeword). The ECC engine 120 according to an embodiment may be implemented as a single error correction and double error detection (SECDED) circuit.

In one embodiment, the ECC engine 120 may include an ECC encoder 121 and an ECC decoder 122.

The ECC encoder 121 may perform an ECC encoding operation. The ECC encoder 121 may generate parity bits for data received from the host 50. For example, the ECC encoder 121 may receive 64-bit data and b'00000000 bits, and generate parity bits using an exclusive OR (XOR) array operation. The b'00000000 bits are bits for generating parity bits for 64-bit data. To generate parity bits for 64-bit data, other particular bits may be used instead of b'00000000 bits.

The ECC decoder 122 may perform an ECC decoding operation. The ECC decoder 122 may generate syndrome data using output data transferred from the volatile memory 110. In addition, the ECC decoder 122 may calculate a position of a bad cell among memory cells included in the volatile memory 110, that is, an error bit position by using the syndrome data. Then, the ECC decoder 122 may correct the bit value of the data corresponding to the error bit position and output the error-corrected data. For example, the bit value of the data corresponding to the error bit position may be corrected by inverting the bit value of the data corresponding to the error bit position.

In an embodiment, the ECC decoder 122 may detect a 2-bit error in the output data transferred from the volatile memory 110. When the ECC engine 120 is implemented as a SECDED circuit, the ECC decoder 122 cannot detect a 2-bit error. Accordingly, the ECC decoder 122 may access the hint data buffer 132. When the hint data corresponding to the memory area in which data has an error of 2 bits is not stored in the hint data buffer 132, the ECC decoder 122 may transmit a hint data request signal requesting generation of hint data to the recovery logic circuit 130. When hint data corresponding to a memory area in which data has an error of 2 bits is stored in the hint data buffer 132, the ECC decoder 122 may correct at least one error among 2-bit errors based on the hint data stored in the hint data buffer 132. A particular embodiment of correcting at least one error among 2-bit errors will be described later with reference to FIGS. 11A to 11C.

When a 2-bit error occurs in the data transferred from the volatile memory 110, the recovery logic circuit 130 may generate hint data indicating the location of the 2-bit error. The recovery logic circuit 130 may store the generated hint data. The recovery logic circuit 130 may provide the stored hint data to the ECC decoder 122 when a 2-bit error occurs in the data transferred from the volatile memory 110. Here, the position of the 2-bit error may correspond to each bit line to which a memory cell in which a 2-bit error occurs among a plurality of bit lines included in the volatile memory 110 is connected.

In an embodiment, the recovery logic circuit 130 may include a recovery controller 131, a hint data buffer 132, and a test data buffer 133.

The recovery controller 131 may generate hint data. In particular, the recovery controller 131 may transmit a test control signal to the volatile memory 110 in response to the data generation request signal received from the ECC decoder 122. The test control signal may instruct the volatile memory 110 to enter the test mode. In addition, the recovery controller 131 may sequentially transfer the first test pattern data and the second test pattern data to the volatile memory 110. When the volatile memory 110 sequentially transfers the first test data and the second test data to the recovery logic circuit 130 in the test mode, the recovery controller 131 may store the first test data and the second test data in the test data buffer 133. The recovery controller 131 may perform an XOR operation using the first test data and the second test data, and store result data including a particular bit value as hint data in the hint data buffer 132.

The hint data buffer 132 may temporarily store hint data corresponding to the volatile memory 110. For example, the memory device 100 may include a plurality of volatile memories 110, and the hint data buffer 132 may store hint data corresponding to each volatile memory. In an embodiment, a plurality of hint data may be managed in a data structure in the form of a table.

The test data buffer 133 may temporarily store the first test data and the second test data in the test mode of the volatile memory 110. The test data buffer 133 may further store the first test pattern data and the second test pattern data to be used in the test mode of the volatile memory 110. The test data buffer 133 may temporarily store the output data DATA_OUT (not illustrated) and the address output from the volatile memory 110 before the test mode is executed.

Figure 2:
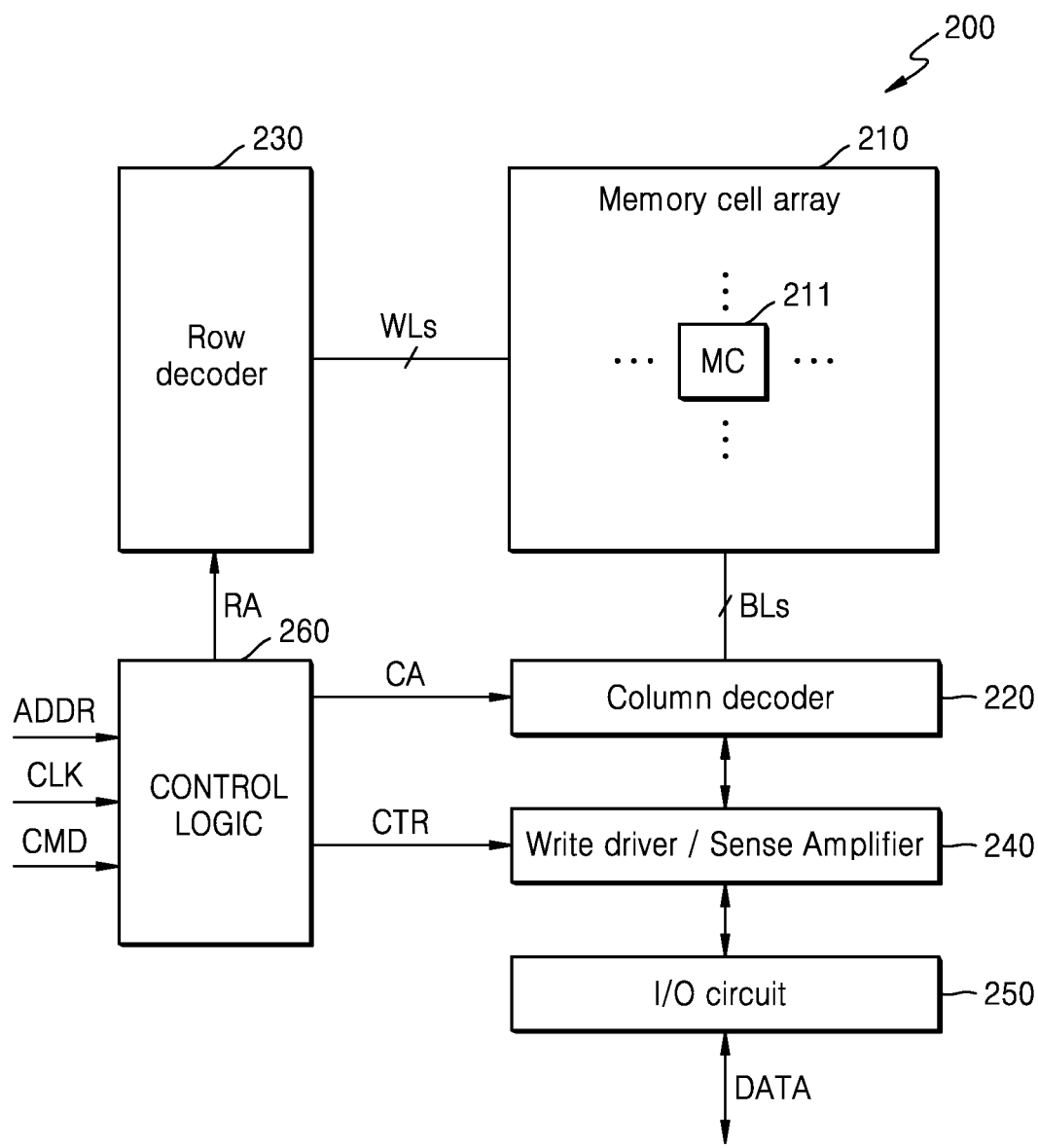
FIG. 2 is a diagram for explaining a volatile memory according to an embodiment.

FIG. 2 is a diagram for explaining a volatile memory according to an embodiment.

Referring to FIG. 2, the volatile memory 200 according to an embodiment may receive a command CMD, an address ADDR, a clock CLK, and input data DATA_IN (not illustrated) during a write operation. For example, the volatile memory 200 may receive a command CMD instructing write, an address ADDR, and input data DATA_IN, and may store the input data DATA_IN in the memory cell area corresponding to the address ADDR in the memory cell array 210. The memory cell area may be a memory area including one or more memory cells.

The volatile memory 200 according to an embodiment may receive a command CMD, an address ADDR, and a clock CLK during a read operation. For example, the volatile memory 200 may receive a command CMD instructing read and an address ADDR, read data stored in the memory cell area corresponding to the address ADDR, and output the read data as output data DATA_OUT.

In one embodiment, the volatile memory 200 may include a memory cell array 210, a column decoder 220, a row decoder 230, a write driver/sense amplifier 240, an input/output (I/O) circuit 250, and a control logic 260.

The memory cell array 210 may include a plurality of memory cells 211. The plurality of memory cells 211 may be arranged at regular intervals. The plurality of memory cells 211 may be defined by word lines WLs and bit lines BLs. In particular, the plurality of memory cells 211 may be positioned at intersections of the word lines WLs and the bit lines BLs. That is, each of the plurality of memory cells 211 may be connected to at least one of the plurality of word lines WLs and may be connected to at least one of the plurality of bit lines BLs.

The column decoder 220 may be connected to the memory cell array 210 through a plurality of bit lines BLs. The column decoder 220 may select at least one bit line from among the plurality of bit lines BLs based on the column address CA.

The row decoder 230 may be connected to the memory cell array 210 through a plurality of word lines WLs. The row decoder 230 may activate at least one word line among the plurality of word lines WLs based on the row address RA. That is, the row decoder 230 may select at least one word line from among the plurality of word lines WLs. Accordingly, memory cells connected to the activated word line may be selected from among the plurality of memory cells 211.

The write driver/sense amplifier 240 may transmit the input data DATA_IN transmitted from the I/O circuit 250 to the column decoder 220. Alternatively, the write driver/sense amplifier 240 may amplify data transmitted from the column decoder 220 and transmit the output data DATA_OUT to the I/O circuit 250. The write driver/sense amplifier 240 may operate as a write driver or a sense amplifier according to the logic level of the control signal CTR. For example, the write driver/sense amplifier 240 may apply current and/or voltage to the plurality of bit lines BLs based on the input data DATA_IN during a write operation, so that values may be input to memory cells connected to the activated word line among the plurality of memory cells 211. The write driver/sense amplifier 240 may detect current and/or voltage received through the plurality of bit lines BLs during a read operation, and identify values stored in memory cells connected to the activated word line among the plurality of memory cells 211. The identified values may be output as output data DATA_OUT.

According to an embodiment, the column decoder 220 and the write driver/sense amplifier 240 may be implemented as one column driver. The column driver may select a bit line according to the column address CA from among the plurality of bit lines BLs, and may operate as a write driver or a sense amplifier according to a logic level of the control signal CTR.

The I/O circuit 250 may transmit the input data DATA_IN to the write driver/sense amplifier 240. Alternatively, the I/O circuit 250 may output the output data DATA_OUT transmitted from the write driver/sense amplifier 240.

The control logic 260 may receive a command CMD, an address ADDR, and a clock CLK, and may generate a row address RA, a column address CA, and a control signal CTR. For example, the control logic 260 may identify the read command by decoding the command CMD, and generate a row address RA, a column address CA, and a control signal CTR to read the output data DATA_OUT from the memory cell array 210. In addition, the control logic 260 may identify the write command by decoding the command CMD, and generate a row address RA, a column address CA, and a control signal CTR to write the input data DATA_IN to the memory cell array 210.

As an example, the input data DATA_IN may be data provided by the host 50 shown in FIG. 1. As another example, the input data DATA_IN may be first test pattern data. As another example, the input data DATA_IN may be second test pattern data.

As an example, the output data DATA_OUT may be data to be provided to the host 50 illustrated in FIG. 1. As another example, the output data DATA_OUT may be first test data. As another example, the output data DATA_OUT may be second test data.

In an embodiment, the control logic 260 may output a row address RA, a column address CA, and a control signal CTR to store the first test pattern data in memory cells connected to the target word line in the test mode. In addition, the control logic 260 may output a row address RA, a column address CA, and a control signal CTR to read the first test data stored in the memory cells connected to the target word line in the test mode. The first test pattern data may be data for storing a first value in memory cells connected to the target word line. That is, all bit values of the first test pattern data may be the first values. The first value may be, for example, a logic high level, "Fh", or "1b". The first test data may be data stored in memory cells connected to the target word line. When a bad cell is included in the target word line and all bit values of the first test pattern data are the first values, the first test data may have at least one second value. The second value is an error bit and may be a logic low level, "0h", or "0b". However, embodiments are not limited thereto, and the first value may be a logic low level and the second value may be a logic high level.

In one embodiment, after the first test data is read, the control logic 260 may output a row address RA, a column address CA, and a control signal CTR to store the second test pattern data in memory cells connected to the target word line in the test mode. In addition, the control logic 260 may output a row address RA, a column address CA, and a control signal CTR to read the second test data stored in the memory cells connected to the target word line in the test mode. The second test pattern data may be data for storing a second value in memory cells connected to the target word line. That is, all bit values of the second test pattern data may be the second values. The second value may be a logic low level, "0h", or "0b" when the first value is a logic high level, "Fh", or "1b". The second test data may be data stored in memory cells connected to the target word line. When a bad cell is included in the target word line and all bit values of the second test pattern data are second values, the second test data may have at least one first value. In this case, the first value may be the value of the error bit.

Figure 3:
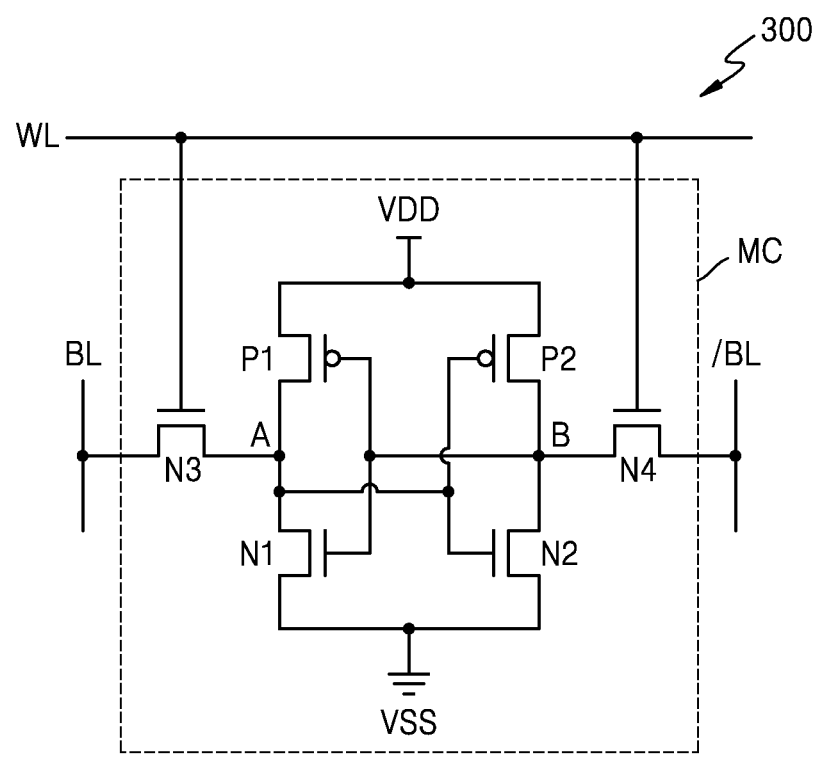
FIG. 3 is a diagram for explaining a memory cell according to an embodiment.

FIG. 3 is a diagram for explaining an embodiment of a memory cell according to an embodiment.

Referring to FIG. 3, the volatile memory 300 illustrated in FIG. 3 may include a memory cell MC. When the volatile memory 300 illustrated in FIG. 3 is implemented as an SRAM, the memory cell MC may be an SRAM cell including six transistors. The memory cell MC may be referred to as a 6T SRAM cell. However, embodiments are not limited thereto, and when the volatile memory 300 illustrated in FIG. 3 is implemented as a DRAM, the memory cell MC may be a DRAM cell including one transistor and one capacitor. Hereinafter, it is assumed that the memory cell MC is an SRAM cell for convenience.

The memory cell MC may include first and second PMOS transistors P1 and P2 and first to fourth NMOS transistors N1, N2, N3, and N4. The first and second PMOS transistors P1 and P2 may be respectively connected between the power supply voltage VDD line and the first node A and the second node B. The first and second NMOS transistors N1 and N2 may be respectively connected between the ground voltage VSS line and the first node A and the second node B. The first node A may be connected to the gate of each of the second PMOS transistor P2 and the second NMOS transistor N2. The second node B may be connected to the gate of each of the first PMOS transistor P1 and the first NMOS transistor N1. The first node A and the second node B may be respectively connected to the bit line BL and the complementary bit line /BL by the third and fourth NMOS transistors N3 and N4. Gates of the third and fourth NMOS transistors N3 and N4 may be connected to the word line WL. The third and fourth NMOS transistors N3 and N4 may be referred to as access transistors or pass transistors.

The memory cell MC may store data and complementary data in the first node A and the second node B, and maintain a latched state. In particular, when the word line WL is enabled in a write operation, data and the complementary data transferred to the bit line BL and the complementary bit line /BL may be latched in the first node A and the second node B through the third and fourth NMOS transistors N3 and N4. On the other hand, when the word line WL is enabled in the read operation, in the memory cell MC, data latched in the first node A and the second node B may be transferred to the bit line BL and the complementary bit line /BL through the third and fourth NMOS transistors N3 and N4.

In an embodiment, the memory cell MC may include a first inverter and a second inverter. The first inverter may include a first PMOS transistor P1 and a first NMOS transistor N1. The second inverter may include a second PMOS transistor P2 and a second NMOS transistor N2.

Figure 4:
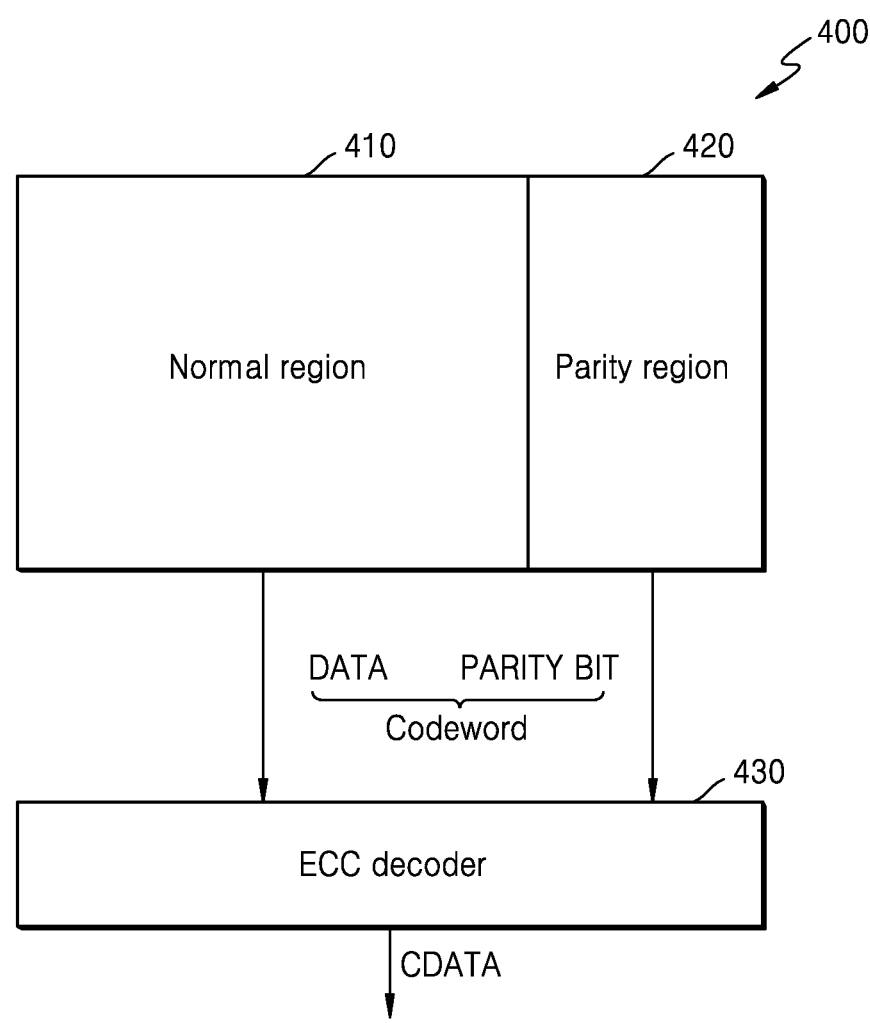
FIG. 4 is a conceptual diagram for explaining error-correcting data according to an embodiment.

FIG. 4 is a conceptual diagram for explaining an embodiment of error-correcting data according to an embodiment. In particular, FIG. 4 exemplarily shows a memory cell array and an ECC decoder included in a memory device.

Referring to FIG. 4, in the memory device 400 illustrated in FIG. 4, a memory cell array may include a normal region 410 and a parity region 420. The normal region 410 is a region in which data DATA provided from the host 50 is stored, and the parity region 420 is a region in which a parity bit corresponding to the data DATA is stored.

In response to the read command transmitted from the host 50, the ECC decoder 430 may receive data DATA and a parity bit. The data DATA and the parity bit PARITY BIT may constitute one codeword. For example, 128-bit data DATA and 8-bit parity bit PARITY BIT may constitute one codeword. In this specification, the data DATA and the parity bit PARITY BIT may be referred to as read data or output data DATA_OUT.

The ECC decoder 430 may calculate the position of the error bit included in the data DATA based on the codeword, correct the error bit, and generate the corrected data CDATA. The corrected data CDATA may be transmitted to the host 50.

Figure 5:
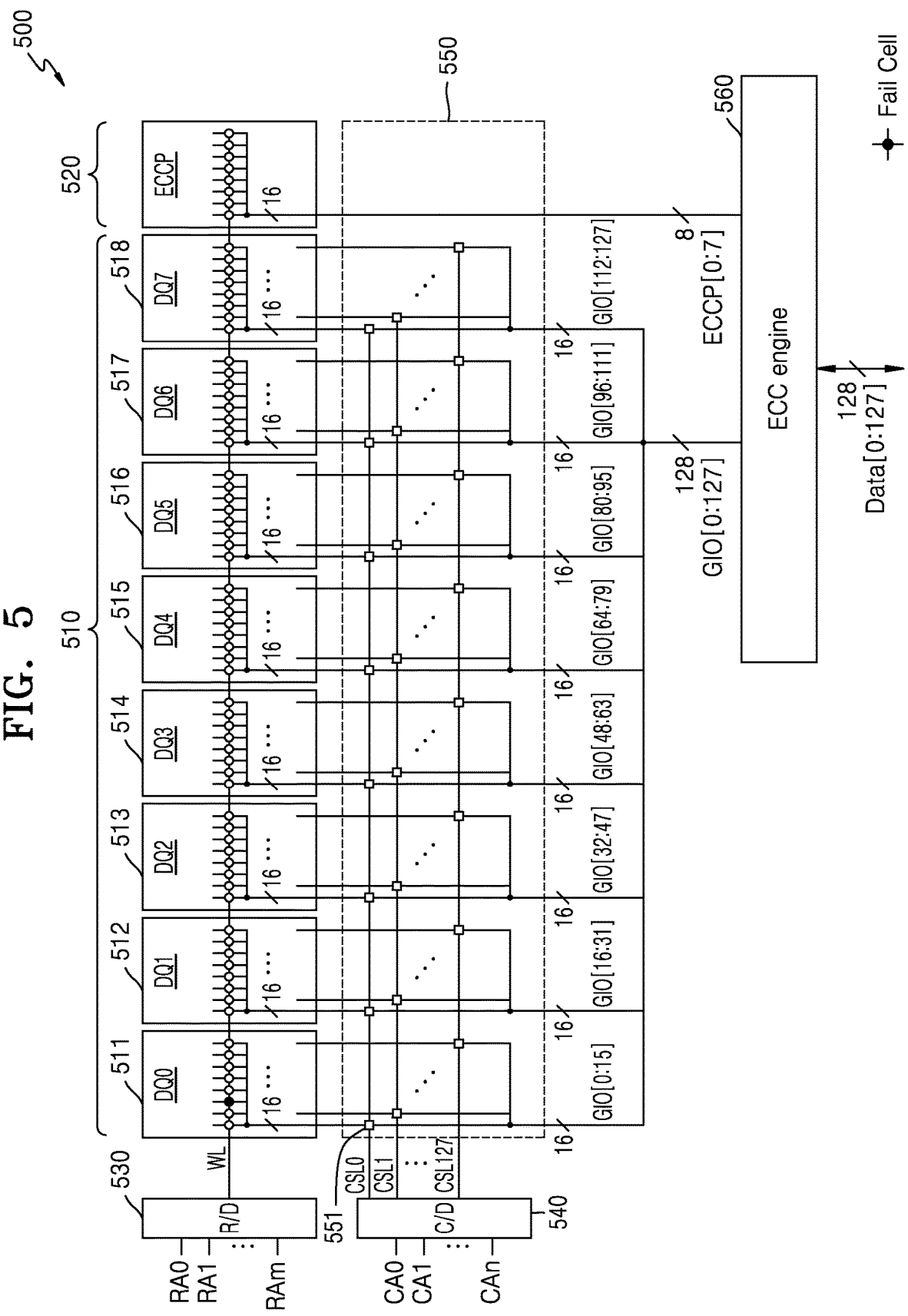
FIG. 5 is a diagram for describing in detail error-correcting data according to an embodiment.

FIG. 5 is a diagram for describing in detail an embodiment of error-correcting data according to an embodiment.

Referring to FIG. 5, the memory device 500 may support the X8 mode. The X8 mode may be a mode in which data corresponding to one unit of the plurality of normal blocks 511 to 518 is input/output through eight data input/output pins DQ0 to DQ7. The ECC engine 560 may perform an ECC operation to correct an error bit included in data bits corresponding to one unit of the normal region 510. As an embodiment, one unit of memory cells may include 128 memory cells, and one unit of data bits may include 128 bits.

The normal region 510 may correspond to the normal region 410 shown in FIG. 4. The normal region 510 may include a plurality of normal blocks 511 to 518. A plurality of memory cells arranged in rows and columns may be arranged in each of the plurality of normal blocks 511 to 518. Because data stored in the memory cells of each of the plurality of normal blocks 511 to 518 is input/output through the corresponding data input/output pins DQ0 to DQ7, hereinafter, the plurality of normal cell blocks 511 to 518 will be referred to as DQ0 to DQ7 cell blocks 511 to 518, respectively.

Rows of each of the DQ0 to DQ7 cell blocks 511 to 518 may include, for example, 8K word lines WL, and columns may include, for example, 1 K bit lines. Memory cells connected to intersections of word lines WL and bit lines may be configured as SRAM cells. However, embodiments are not limited thereto, and the memory cells may include DRAM cells.

The word lines WL of the DQ0 to DQ7 cell blocks 511 to 518 may be accessed by the row addresses RA0 to RAm, and the bit lines are accessed by the column addresses CA0 to CAn. The row addresses RA0 to RAm may be decoded through the row decoder (R/D) 530, and the word line WL may be selected by the decoded row addresses RA0 to RAm. The column addresses CA0 may be decoded through the column decoder (C/D) 540. The column decoder 540 may decode the column addresses CA0 to CAn to generate column select signals CSL0 to CSL127 for selecting a bit line. To support a burst length that represents the maximum number of column locations that may access bit lines, bit lines corresponding to the burst length may be accessed concurrently. For example, the burst length may be 16.

Accordingly, the bit lines may be connected to the column selector 550 connected to each of the 128 column select signals CSL0 to CSL127, and 16 bit lines may be simultaneously selected by one column selector 550. The column selectors 550 each may include 16 switches, and may be turned on by the column select signals CSL0 to CSL127. The column selector 550 switched by 128 column select signals CSL0 to CSL127 may constitute a column selection circuit.

In the DQ0 cell block 511, a plurality of memory cells may be connected to the word line WL accessed by the row addresses RA0 to RAm. 16 of the plurality of memory cells connected to the word line WL may be selected by the column selector 550 connected to the CSL0 column select signal to be connected to the first data lines GIO[0:15]. The first data lines GIO[0:15] may have 16 bits.

Also in the DQ1 cell block 512, 16 of the plurality of memory cells connected to the word line WL may be selected by the column selector 550 connected to the CSL0 column select signal to be connected to the second data lines GIO[16:31]. In each of the remaining DQ2-DQ7 cell blocks 513 to 518, 16 of the plurality of memory cells connected to the word line WL are selected by the column selector 550 connected to the CSL0 column select signal to be connected to corresponding third data lines GIO[32:47], fourth data lines GIO[48:63], fifth data lines GIO[64:79], sixth data lines GIO[80:95], seventh data lines GIO[96:111] and eighth data lines GIO[112:127].

In the case of a write operation, data to be written in the DQ0 to DQ7 cell blocks 511 to 518 may be transferred to the first to eighth data lines GIO[0:127]. Through each of the first to eighth data lines GIO[0:127], first to eighth burst data to be respectively written in the DQ0 to DQ7 cell blocks 511 to 518, a total of 128 bits of data (Data[0:127]), may be received. The received 128-bit data (Data[0:127]) may be written into 16 memory cells of each of the DQ0 to DQ7 cell blocks 511 to 518 selected by the column selector 550 connected to a particular column select signal (e.g., CSL0 column select signal) among a plurality of memory cells connected to the word line WL.

When there is one bad cell among the memory cells connected to one word line WL in the DQ0 to DQ7 cell blocks 511 to 518, the ECC cell array 520 may be used to correct data read from defective cells (or referred as fault cells, bad cells). For example, among the memory cells of the DQ0 to DQ7 cell blocks 511 to 518 selected by the column selector 550 connected to the word line WL and the CSL0 column select signal, there may be one defective cell in the DQ0 cell block 511. The defective cell may be any one of the memory cells selected by the column selector 550 connected to the word line WL and the CSL0 column select signal in the DQ1-DQ7 cell blocks 512 to 518, not the defective cell of the DQ0 cell block 511. The ECC cell array 520 may be controlled by the ECC engine 560, and may be used to detect and correct defective cells of the DQ0 to DQ7 cell blocks 511 to 518.

The ECC cell array 520 may be configured with 8K word lines, similarly to the DQ0 to DQ7 cell blocks 511 to 518. Unlike the DQ0 to DQ7 cell blocks 511 to 518, the ECC cell array 520 may include 8 bit lines. Memory cells connected to intersections of word lines WL and bit lines of the ECC cell array 520 may also be configured as SRAM cells.

In the ECC cell array 520, eight bit lines may be connected to the parity data line ECCP[0:7]. Parity bits for data Data[0:127] stored in defective cells of the DQ0 to DQ7 cell blocks 511 to 518 may be transmitted to the parity data line ECCP[0:7]. The parity bits may be stored in and read from eight memory cells in the ECC cell array 520 through the parity data line ECCP[0:7]. In this case, the eight memory cells of the ECC cell array 520 may be connected to the same word line WL as the word line WL of the defective cell.

The ECC engine 560 may detect and correct bad cells of the DQ0 to DQ7 cell blocks 511 to 518. In a write operation, the ECC engine 560 may generate parity bits for data Data[0:127] and transmit the parity bits to the parity data line ECCP[0:7]. Parity bits on the parity data line ECCP[0:7] may be stored in memory cells of the ECC cell array 520 connected to the word line WL of the bad cell. In a read operation, the ECC engine 560 may receive data transmitted to the first to the eighth data lines GIO[0:127] and data transmitted to the parity data line ECCP[0:7]. Data transferred to the first to eighth data lines GIO[0:127] may be data read from memory cells connected to the word line WL of the defective cell in the DQ0 to DQ7 cell blocks 511 to 518, and data transferred to the parity data line ECCP[0:7] may be parity bits read from memory cells connected to the corresponding word line WL in the ECC cell array 520.

In one embodiment, the ECC engine 560 may detect and correct an error bit due to a bad cell using the codeword transferred to the first to eighth data lines GIO[0:127] and the parity data line ECCP[0:7]. Here, the error bit may be, for example, an error of 1 bit. The ECC engine 560 may receive the data transferred to the first to eighth data lines GIO[0:127] and the parity data line ECCP[0:7], generate the syndrome data, calculate the position of the bad cell, that is, the position of the error bit, correct the data corresponding to the position of the error bit, and output the corrected data.

In an embodiment, the ECC engine 560 may detect a 2-bit error due to a bad cell using data transferred to the first to eighth data lines GIO[0:127] and the parity data line ECCP [0:7]. However, the ECC engine 560 may not be able to correct a 2-bit error only with the codeword transferred to the first to eighth data lines GIO[0:127] and the parity data line ECCP[0:7]. In this case, the ECC engine 560 may correct at least one error bit among 2-bit errors based on hint data stored in the recovery logic circuit 130.

Figure 6:
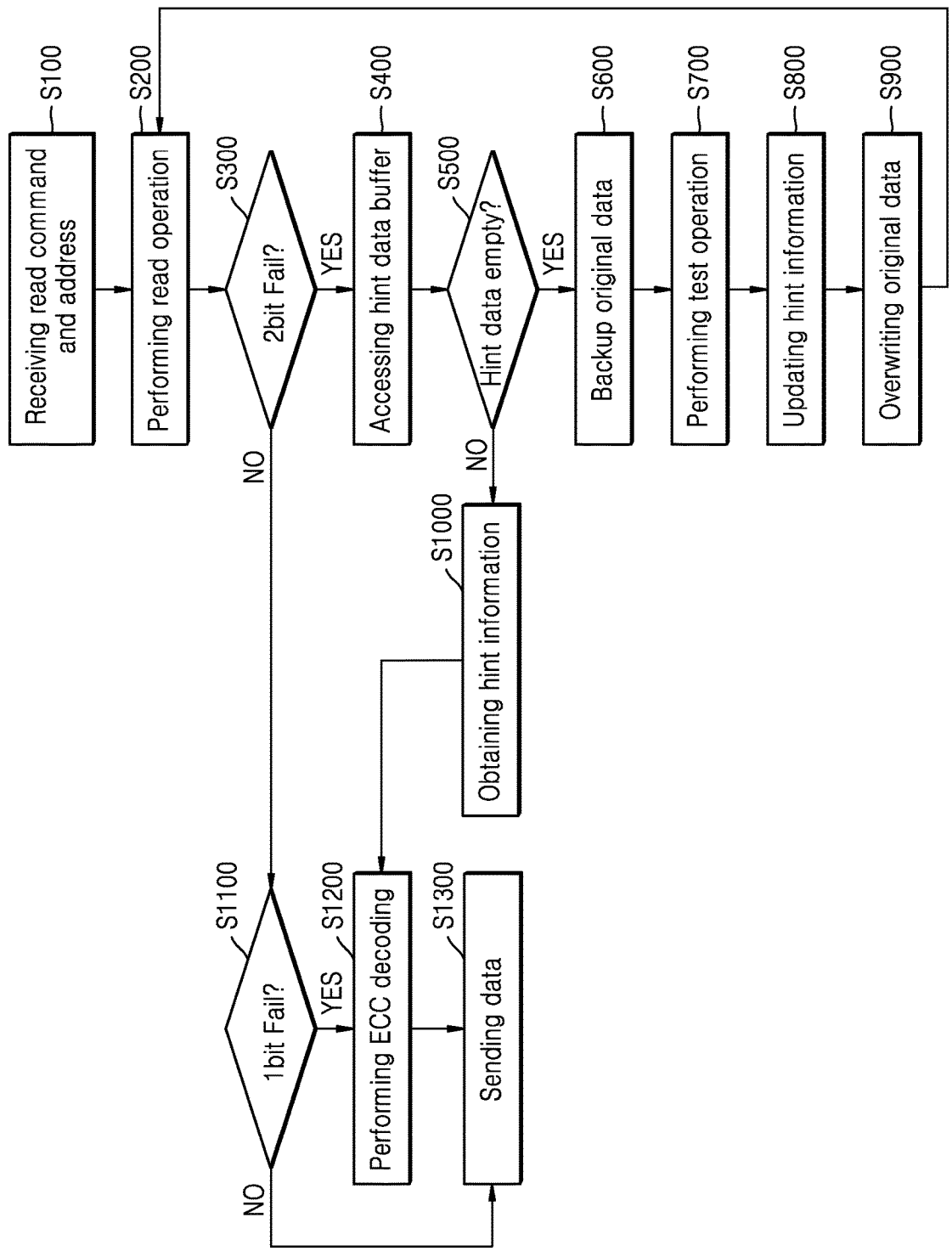
FIG. 6 is a flowchart illustrating a method of operating a memory device according to an embodiment.

FIG. 6 is a flowchart illustrating a method of operating a memory device according to an embodiment.

Referring to FIGS. 1, 2, 5 and 6, in operation S100, the memory device 100 receives a read command and an address from the host 50.

In operation S200, the volatile memory 110 performs a read operation. For example, the control logic 260 receives a command CMD instructing to read, an address ADDR, and a clock CLK, identifies the read command by decoding the command CMD, and outputs a row address RA, a column address CA, and a control signal CTR. Each of the column decoder 220, the row decoder 230, the write driver/sense amplifier 240, and the I/O circuit 250 operates, so that data stored in memory cells connected to the target word line may be output to the outside of the volatile memory 110 or 200 as output data DATA_OUT.

In operation S300, the ECC engine 120 determines whether the output data DATA_OUT is a 2-bit fail. The 2-bit fail may indicate that the output data DATA_OUT has an error of 2 bits. For example, the ECC decoder 122 detects a 2-bit error in the output data DATA_OUT by performing a decoding operation.

When a 2-bit error occurs in the output data DATA_OUT (S300, Yes), in operation S400, the ECC decoder 122 accesses the hint data buffer 132. In operation S500, the ECC decoder 122 determines whether hint data is stored in the hint data buffer 132.

When hint data corresponding to the address ADDR delivered by the host 50 is not stored in the hint data buffer 132 (S500, Yes), in operation S600, the ECC engine 120 backs up the original data. The ECC decoder 122 may temporarily store the output data DATA_OUT. Alternatively, the ECC decoder 122 may transmit the output data DATA_OUT to the recovery logic circuit 130, and the recovery logic circuit 130 may temporarily store the output data DATA_OUT. The original data may be data stored in memory cells connected to the target word line. For example, the original data may be the output data DATA_OUT.

In operation S700, the recovery logic circuit 130 performs a test operation. For example, the ECC decoder 122 transmits a hint data request signal to the recovery logic circuit 130. The recovery controller 131 transmits a test control signal to the volatile memory 110 in response to the hint data request signal. The recovery controller 131 controls the volatile memory 110 to perform a write operation on the first test pattern data and a read operation on the first test data. The recovery controller 131 controls the volatile memory 110 to perform a write operation on the second test pattern data and a read operation on the second test data.

In operation S800, the recovery logic circuit 130 updates hint information. The hint information is information indicated by the hint data and may be information indicating the location of a normal cell and a location of a bad cell. For example, the recovery controller 131 generates hint data indicating the location of a bad cell by performing an XOR operation on the first test data and the second test data, and stores the hint data in the hint data buffer 132.

In operation S900, the recovery logic circuit 130 overwrites the original data. In this case, overwriting may be that the original data is stored in a memory cell area in which the original data is previously stored. For example, the recovery controller 131 transfers a write command, an address ADDR, and original data to the volatile memory 110, and the volatile memory 110 stores the original data in a memory cell area corresponding to the address ADDR. The second test data stored in the memory cell area corresponding to the address ADDR is replaced with original data. Operation S200 is then performed again.

When hint data corresponding to the address ADDR delivered by the host 50 is stored in the hint data buffer 132 (S500, No), in operation S1000, the ECC engine 120 acquires hint information. For example, the ECC decoder 122 accesses the hint data buffer 132 to receive hint data. After operation S1000 is performed, operation S1200 is performed.

When a 2-bit error does not occur in the output data DATA_OUT (S300, No), in operation S1100, the ECC engine 120 determines whether the output data DATA_OUT is 1-bit fail. The 1-bit fail may indicate that the output data DATA_OUT has an error of 1 bits. For example, the ECC decoder 122 detects a 1-bit error in the output data DATA_OUT.

In operation S1200, the ECC engine 120 performs an ECC decoding operation on the output data DATA_OUT. For example, the ECC decoder 122 corrects an error bit in the output data DATA_OUT having an error of 1 bit. As another example, the ECC decoder 122 may correct at least one error among 2-bit errors in the output data DATA_OUT based on the hint data.

In operation S1300, the ECC engine 120 may transmit the corrected data to the host 50.

Figure 7:
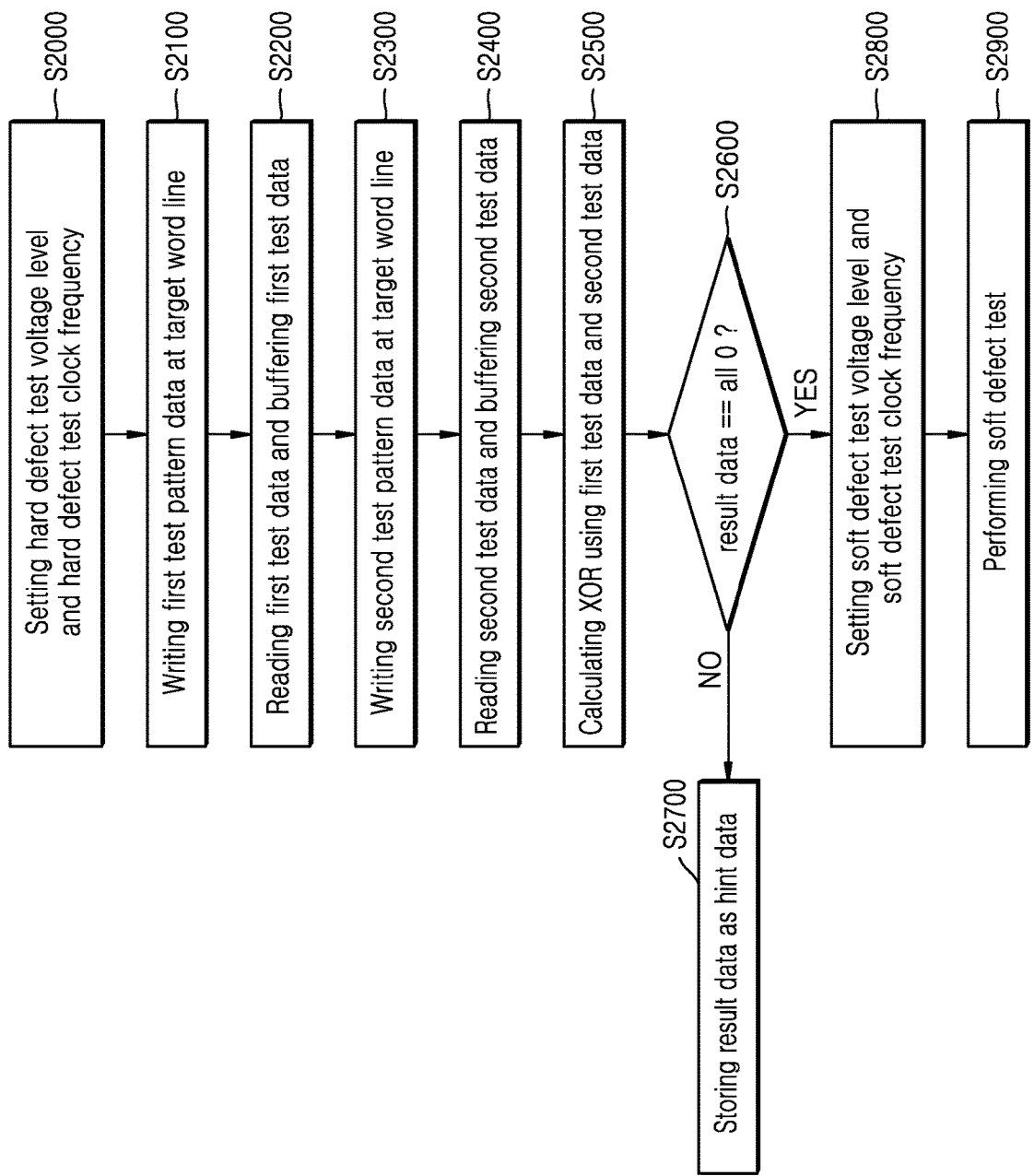
FIG. 7 is a flowchart illustrating a hard defect test according to an embodiment.

FIG. 7 is a flowchart illustrating a hard defect test according to an embodiment.

The hard defect test may be a test for detecting a bad cell when the volatile memory 110 operates at a relatively high internal voltage or a low clock frequency. The hard defect test may be referred to as a first test operation.

Referring to FIGS. 1 and 7, in operation S2000, the recovery logic circuit 130 sets the level of the hard defect test voltage and the frequency of the hard defect test clock. For example, the recovery logic circuit 130 transmits a setting request signal requesting to change the internal voltage and the frequency of clock to the host 50, and the host 50 transmits the first internal voltage having the hard defect test voltage level and the first clock having the hard defect test clock frequency to the memory device 100 in response to the setting request signal. In an embodiment, the hard defect test voltage may have a higher level than the internal voltage used in the volatile memory 110 in a steady state. The hard defect test clock may have a frequency less than a frequency of a clock used in the volatile memory 110 in a steady state.

In operation S2100, the volatile memory 110 writes the first test pattern data to the target word line under the control of the recovery logic circuit 130. For example, the recovery controller 131 transfers a write command, an address, and first test pattern data to the volatile memory 110, and the first test pattern data is stored in memory cells connected to a target word line.

In operation S2200, the volatile memory 110 reads the first test data under the control of the recovery logic circuit 130, and the recovery logic circuit 130 buffers the read first test data. For example, the recovery controller 131 transfers a read command and an address to the volatile memory 110, and the volatile memory 110 outputs first test data. The recovery controller 131 temporarily stores first test data in the test data buffer 133.

In operation S2300, the volatile memory 110 writes the second test pattern data to the target word line under the control of the recovery logic circuit 130.

In operation S2400, the volatile memory 110 reads the second test data under the control of the recovery logic circuit 130, and the recovery logic circuit 130 buffers the read second test data.

In operation S2500, the recovery logic circuit 130 performs an XOR operation using the first test data and the second test data.

In operation S2600, the recovery logic circuit 130 checks whether all values of the result data generated by the XOR operation are particular values, for example, "0h".

When the result data has at least one first value (e.g., "Fh" or "1b") (S2600, No), in operation S2700, the recovery logic circuit 130 stores the result data as hint data. For example, the recovery controller 131 temporarily stores the result data in the hint data buffer 132.

When all the values of the result data are the second values (e.g., "0h") (S2600, Yes), it may be determined that a hard defect has not occurred in the volatile memory 110. In operation S2800, the recovery logic circuit 130 sets the level of the soft defect test voltage and the frequency of the soft defect test clock. For example, the recovery logic circuit 130 transmits a setting request signal requesting to change the internal voltage and the frequency of clock to the host 50, and the host 50 transmits the second internal voltage having the soft defect test voltage level and the second clock having the soft defect test clock frequency to the memory device 100 in response to the setting request signal. In an embodiment, the soft defect test voltage may have a level lower than the internal voltage used in the volatile memory 110 in a steady state. The soft defect test clock may have a frequency greater than a frequency of a clock used in the volatile memory 110 in a steady state. According to an embodiment, the recovery logic circuit 130 may set only the soft defect test voltage or set only the soft defect test clock.

In operation S2900, the recovery logic circuit 130 performs a soft defect test. The soft defect test will be described later with reference to FIG. 8.

Figure 8:
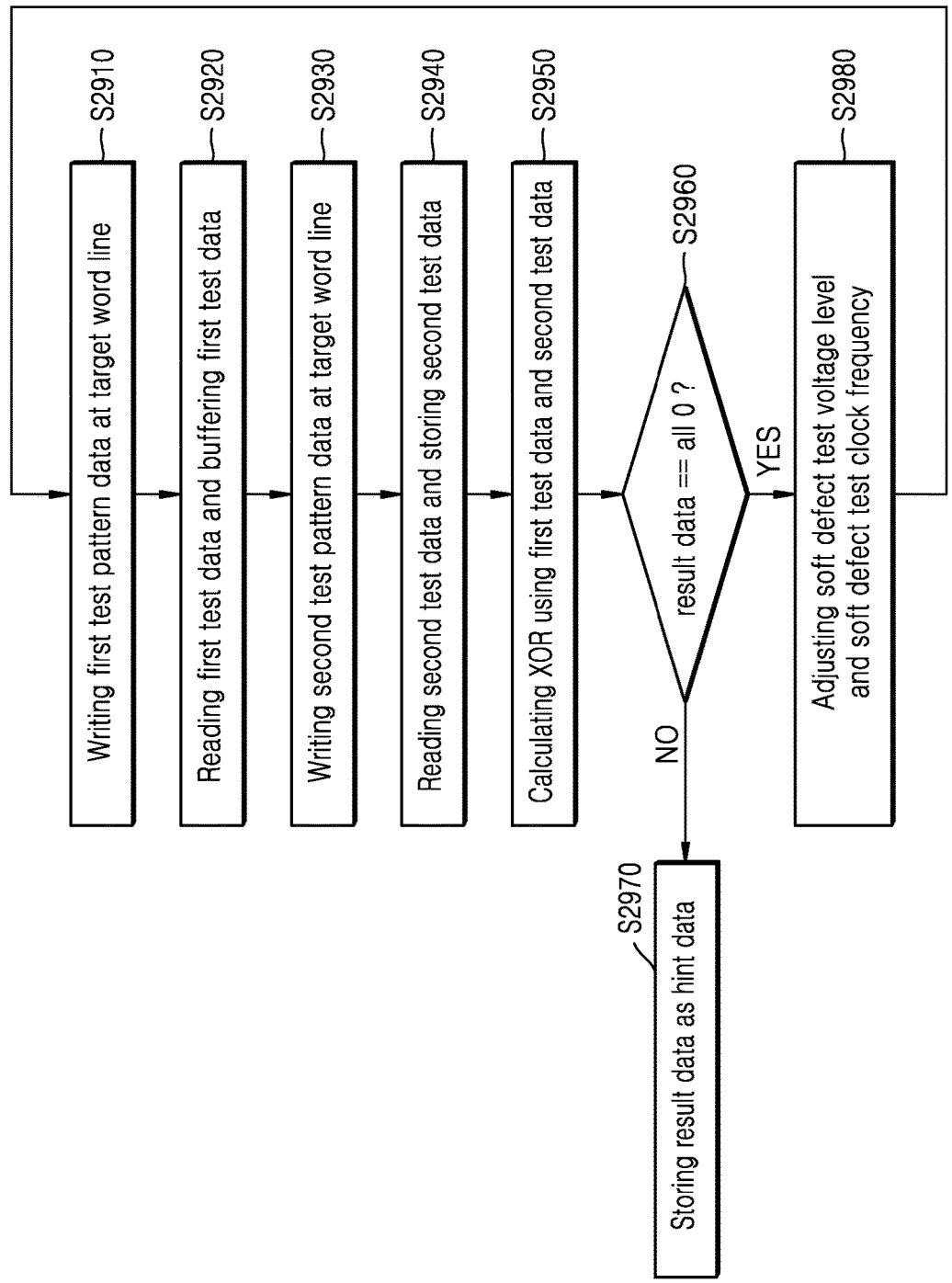
FIG. 8 is a flowchart illustrating a soft defect test according to an embodiment.

FIG. 8 is a flowchart illustrating a soft defect test according to an embodiment.

The soft defect test may be a test for detecting a bad cell when the volatile memory 110 operates at a relatively low internal voltage or a high clock frequency. The soft defect test may be referred to as a second test operation.

Referring to FIGS. 1 and 8, the operations performed in operations S2910 to S2960 may be the same as the operations performed in operations S2100 to S2600 described above with reference to FIG. 7. That is, the first test pattern data is written in operation S2910, the first test data is read and buffered in operation S2920, the second test pattern data is written in operation S2930, the second test data is read and buffered in operation S2940, and the first test data and the second test data are XORed in operation S2950. In operation S2960, the recovery logic circuit 130 checks whether all values of the result data generated by the XOR operation are the second values, for example, "0h".

When the result data has at least one first value (e.g., "Fh") (S2960, No), in operation S2970, the recovery logic circuit 130 stores the result data as hint data.

If the values of the result data are all second values (e.g., "0h") (S2960, Yes), in operation S2980, the recovery logic circuit 130 adjusts the level of the soft defect test voltage and the frequency of the soft defect test clock. For example, the recovery logic circuit 130 transmits a setting request signal requesting to change the internal voltage and the frequency of clock to the host 50, and the host 50 transmits to the memory device 100 a third internal voltage having a level lower than the level of the second internal voltage (refer to FIG. 7) and a third clock having a frequency greater than the frequency of the second clock in response to the setting request signal. According to an embodiment, the recovery logic circuit 130 may adjust only the soft defect test voltage or only the soft defect test clock. After operation S2980 is performed, operation S2910 is performed, and operations S2910 to S2960 and S2980 are repeatedly performed until the result data has at least one first value (e.g., "Fh").

FIGS. 9A to 9C are diagrams for explaining hint data according to an embodiment.

Referring to FIG. 9A, hint data may be managed as a data structure of a hint table or a bitmap. When a 2-bit error occurs in the output data DATA_OUT, the hint data may have a first value or a second value for each bit line with respect to a particular segment (SEG). Here, a particular segment may indicate a particular volatile memory (e.g., the volatile memory 110 shown in FIG. 1). If more than one volatile memory 110 is included in the memory device 100, there may be two or more segments. The number of bit lines may be, for example, 136. However, embodiments are not limited thereto. Hereinafter, it is assumed that the number of bit lines is 136 (BL No. 0 to BL No. 135). In one embodiment, the first value (e.g., "1b") may indicate that an error has occurred in the corresponding bit line, and the second value (e.g., "0b") may indicate that the corresponding bit line is normal. However, embodiments are not limited thereto. Referring to FIG. 9A, for example, when bad cells exist in bit line 6 and bit line 71, respectively, a value of hint data for bit line 6 and bit line 71 may be "1b", and a value of hint data for the remaining bit lines may be "0b". However, embodiments are not limited thereto. Hereinafter, for convenience, it is assumed that bad cells exist in bit line 6 and bit line 71, respectively.

Even if a 2-bit error occurs in the output data DATA_OUT, the hint data may have a first value with respect to any one of the two bit lines in which the error occurs. Referring to FIG. 9B, for example, even if bad cells occur in bit line 6 and bit line 71, respectively, the value of hint data for bit line 6 may be "0b", the value of hint data for bit line 71 may be "1b", and the value of hint data for the remaining bit lines may be "0b". Referring to FIG. 9C, for example, even if bad cells occur in bit line 6 and bit line 71, respectively, the value of hint data for bit line 6 may be "1b", the value of hint data for bit line 71 may be "0b", and the value of hint data for the remaining bit lines may be "0b".

Figure 10:
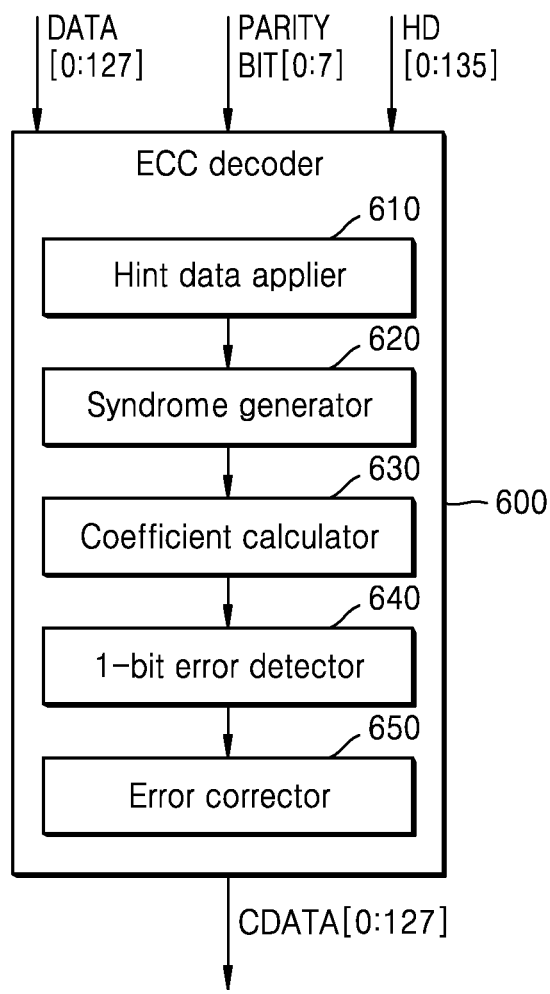
FIG. 10 is a diagram for explaining an ECC decoder according to an embodiment.

FIG. 10 is a diagram for explaining an ECC decoder according to an embodiment.

Referring to FIGS. 1, 5 and 10, the ECC decoder 600 may correspond to the ECC decoder 122 shown in FIG. 1. The ECC decoder 600 may receive the data DATA[0:127] transferred to the first to eighth data lines GIO[0:127] and the parity bit PARITY BIT[0:7] transferred to the parity data line ECCP[0:7]. The data DATA[0:127] and the parity bit PARITY BIT[0:7] may compose the output data DATA_OUT as one codeword. The ECC decoder 600 may receive hint data HD[0:135] from the recovery logic circuit 130. The ECC decoder 600 may output corrected data CDATA[0:127] by correcting an error bit based on the output data DATA_OUT and the hint data HD[0:135].

In one embodiment, the ECC decoder 600 may include a hint data applier 610, a syndrome generator 620, a coefficient calculator 630, a 1-bit error detector 640, and an error corrector 650.

The hint data applier 610 performs an XOR operation on the output data DATA_OUT (e.g., data DATA[0:127] and parity bit PARITY BIT[0:7]) and the hint data HD[0:135] to output data in which at least one error bit is corrected. Data in which at least one error bit is corrected may be transmitted to the syndrome generator 620. The syndrome generator 620 may receive the 128-bit data DATA[0:127] and the parity bit PARITY BIT[0:7] and generate syndrome data using an XOR array operation. The coefficient calculator 630 may calculate the coefficient of the error location equation by using the syndrome data. For example, The coefficient calculator 630 may calculate the coefficient of the error location equation by performing a key equation algorithm. In one embodiment, The coefficient calculator 630 may include key equation solver that generate an error location equation by using Berlekamp-Massey algorithm, Step-By-Step (SBS) algorithm, Euclidean algorithm, or modified Euclidean algorithm. The error location equation may be an equation based on the reciprocal of the position of the error bit (or an inverse of an error bit). The error location equation may be referred to as an error location polynomial. In one embodiment, The error location equation for 1-bit error correction may be shown in Equation 1 below.

$$s1x+1=0 \qquad \text{Equation 1}$$

in this Equation 1, "s1" is a first syndrome (or a first partial syndrome, S1), and "x" is an unknown number.

In another embodiment, the error location equation for 2-bit error correction may be a quadratic equation including first and second syndromes as coefficients.

The 1-bit error detector 640 may calculate the position of the error bit by using the syndrome data. For example, The 1-bit error detector 640 may calculate at least one root (or solution) of the error location equation by performing a Chien search algorithm, and the reciprocal of the root may be a 2-bit error location. The error corrector 650 may determine the position of the error bit based on the detection result of the 1-bit error detector 640. For example, the error corrector 650 may determine the position of the error bit by performing an error evaluate algorithm. The error corrector 650 may correct the error by inverting the value of the bit in which the error occurs according to the determined position information of the error bit, and may output corrected data CDATA.

Figure 11A:
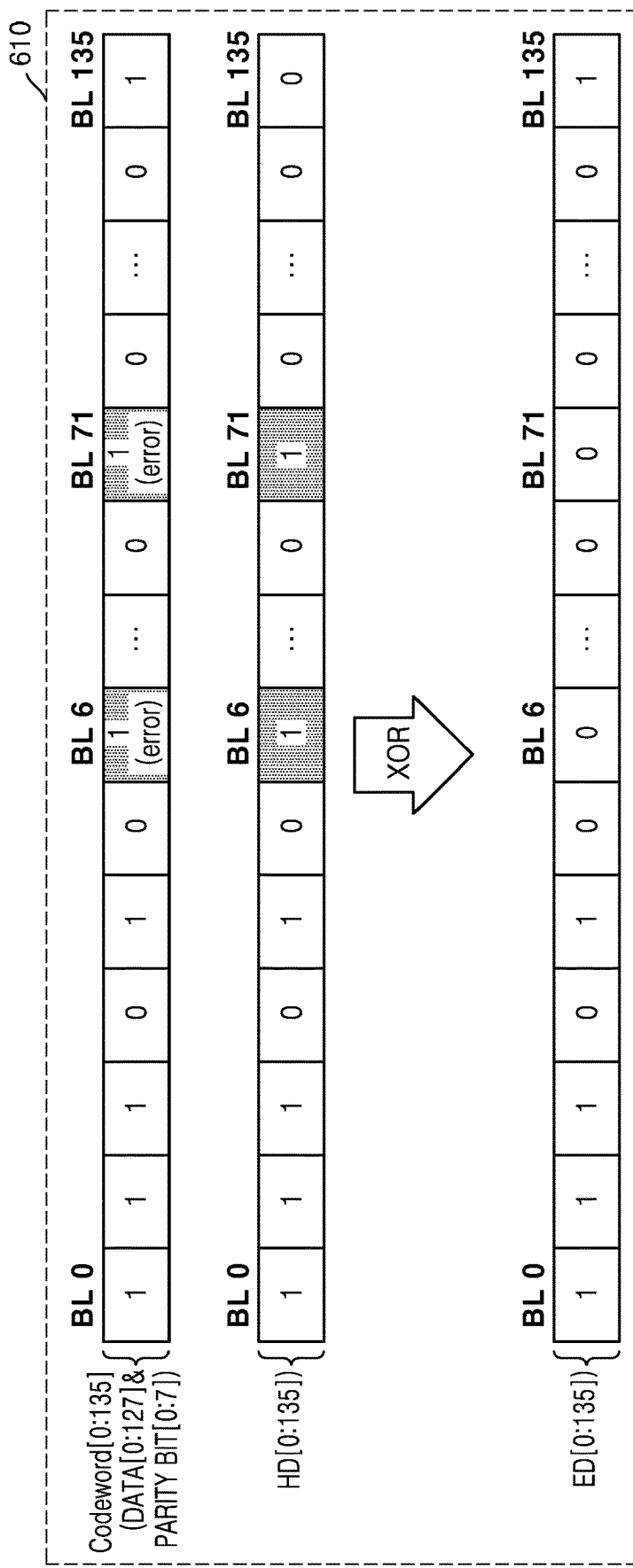
FIGS. 11A, 11B and 11C are diagrams for explaining an operation of a hint data applier according to an embodiment.
Figure 11B:
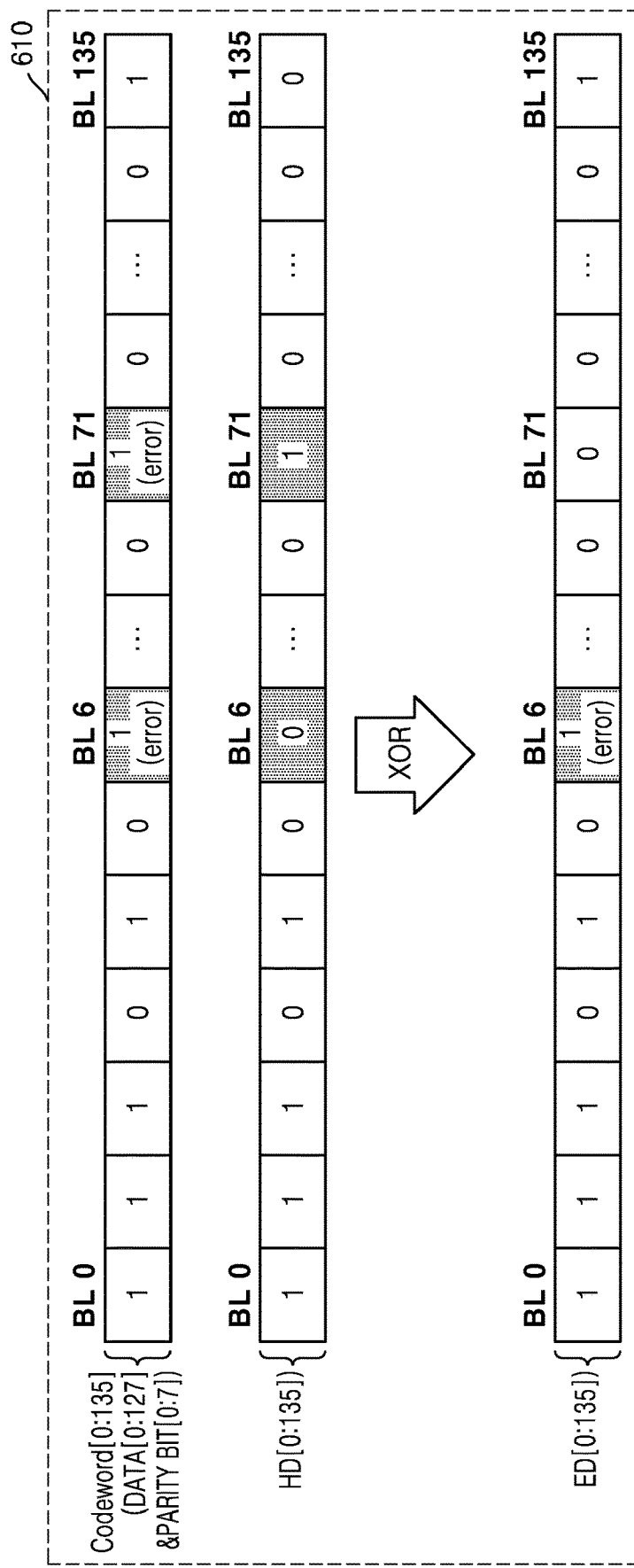
Figure 11C:
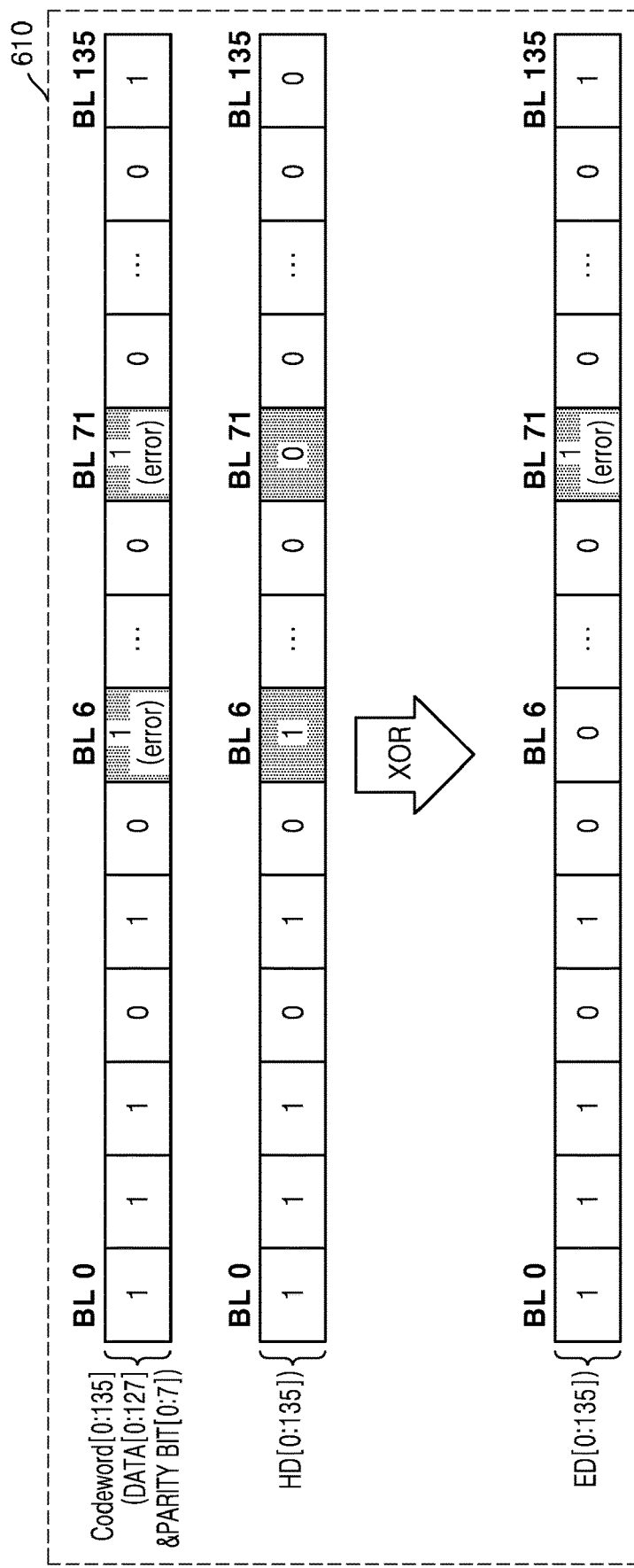

FIGS. 11A to 11C are diagrams for explaining an operation of a hint data applier according to an embodiment.

In the following description, as an example, the number of bit lines is 136, and a 2-bit error occurs in the codeword Codeword[0:135] composed of data DATA[0:127] and a parity bit PARITY BIT[0:7], and it is assumed that cells located in the 6th bit line BL 6 and the 71st bit line BL 71 in the codeword Codeword[0:135] are bad cells.

Referring to FIGS. 9A and 11A, in FIG. 11A, a value of hint data HD[0:135] for the 6th bit line BL 6 and the 71st bit line BL 71 among the 0th to 135th bit lines BL 0 to BL 135 may be "1b" and a value of hint data HD[0:135] for the remaining bit lines may be "0b". The hint data applier 610 may perform an XOR operation on a codeword Codeword [0:135] and hint data HD[0:135]. In this case, the bit values of the codeword Codeword[0:135] for the 6th bit line BL 6 and the 71st bit line BL 71 are inverted. The operation data ED[0:135] shown in FIG. 11A may be data in which all errors occurring in the codeword Codeword[0:135] are corrected.

Referring to FIGS. 9B and 11B, in FIG. 11B, a value of the hint data HD[0:135] for the 71st bit line BL 71 among the 0th to 135th bit lines BL 0 to BL135 may be "1b", and a value of hint data HD[0:135] for the remaining bit lines may be "0b". The hint data applier 610 may perform an XOR operation on a codeword Codeword[0:135] and hint data HD[0:135]. In this case, the bit value of the codeword Codeword[0:135] for the 71st bit line BL 71 is inverted and the bit value of the codeword Codeword[0:135] for the 6th bit line BL 6 is non-inverted. The operation data ED[0:135] illustrated in FIG. 11B may be data including an error bit corresponding to the sixth bit line BL 6. That is, the operation data ED[0:135] may be a codeword Codeword[0:135] including an error of 1 bit. Because the operation data ED[0:135] shown in FIG. 11B is a codeword Codeword[0:135] including an error of 1 bit, a 1-bit error in the operation data ED[0:135] shown in FIG. 11B is corrected by the syndrome generator 620, the coefficient calculator 630, the 1-bit error detector 640, and the error corrector 650.

Referring to FIGS. 9C and 11C, in FIG. 11C, a value of the hint data HD[0:135] for the 6th bit line BL 6 among the 0th to 135th bit lines BL 0 to BL 135 may be "1b", and a value of hint data HD[0:135] for the remaining bit lines may be "0b". The hint data applier 610 may perform an XOR operation on a codeword Codeword[0:135] and hint data HD[0:135]. In this case, a bit value of the codeword Codeword[0:135] for the 6th bit line BL 6 is inverted and a bit value of the codeword Codeword[0:135] for the 71st bit line BL 71 is non-inverted. The operation data ED[0:135] shown in FIG. 11C is data including an error bit corresponding to the 71st bit line BL 71, and may be treated as a codeword Codeword[0:135] including an error of 1 bit. In the operation data ED[0:135] shown in FIG. 11C, the 1-bit error may be corrected by the syndrome generator 620, the coefficient calculator 630, the 1-bit error detector 640, and the error corrector 650.

Figure 12:
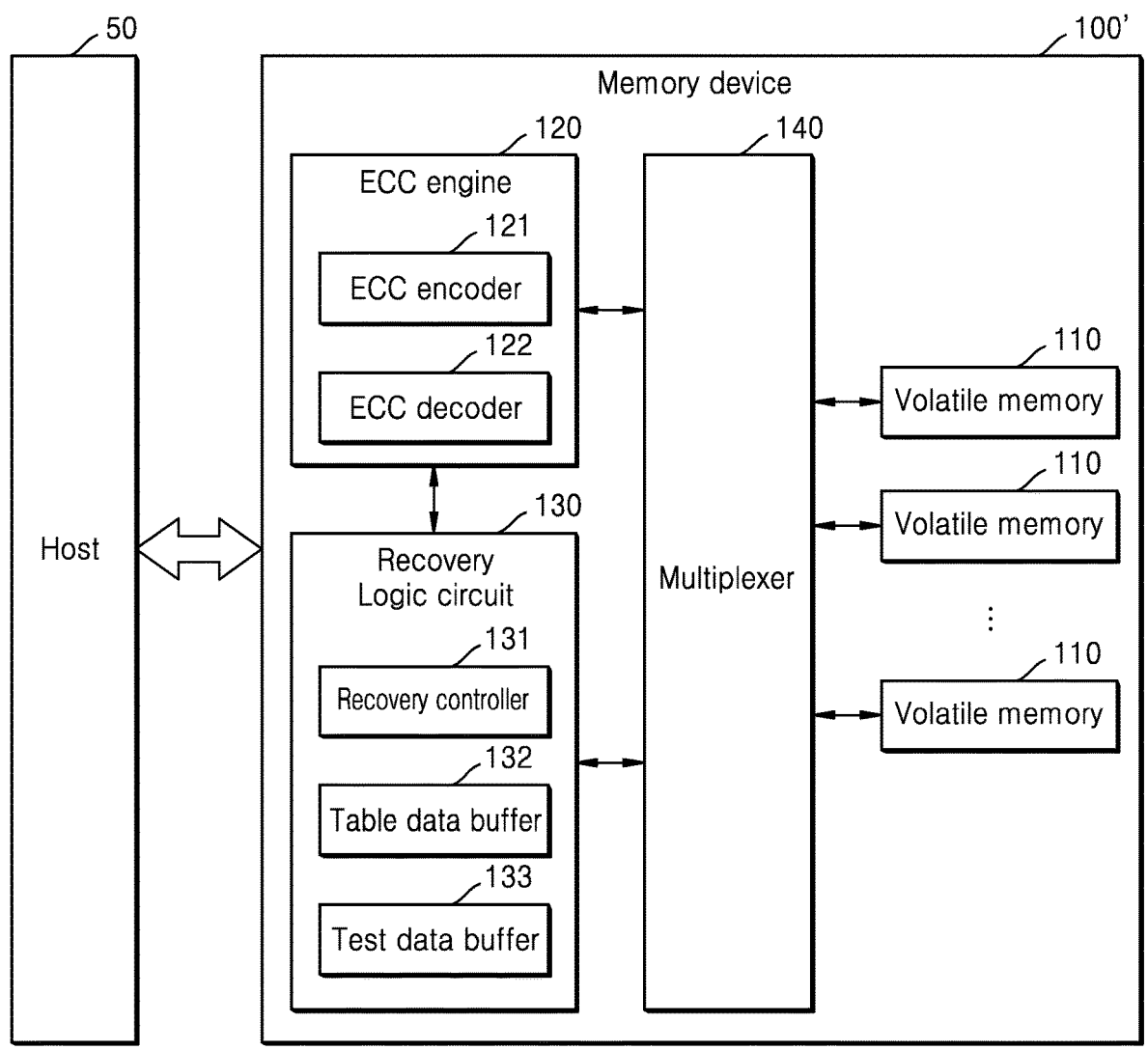
FIG. 12 is a view for explaining an electronic device according to another embodiment.

FIG. 12 is a view for explaining an electronic device according to another embodiment.

Referring to FIG. 12, an electronic device may perform the operation of the electronic device illustrated in FIG. 1.

An electronic device according to an embodiment may include a host 50 and a memory device 100'. The host 50 is the same as that shown in FIG. 1. The memory device 100' may include a plurality of volatile memories 110, an ECC engine 120, a recovery logic circuit 130, and a multiplexer 140. Each of the plurality of volatile memories 110 may have a memory area corresponding to consecutive addresses. The multiplexer 140 may select one or more volatile memories 110 corresponding to the address received from the host 50 from among the plurality of volatile memories 110.

Figure 13:
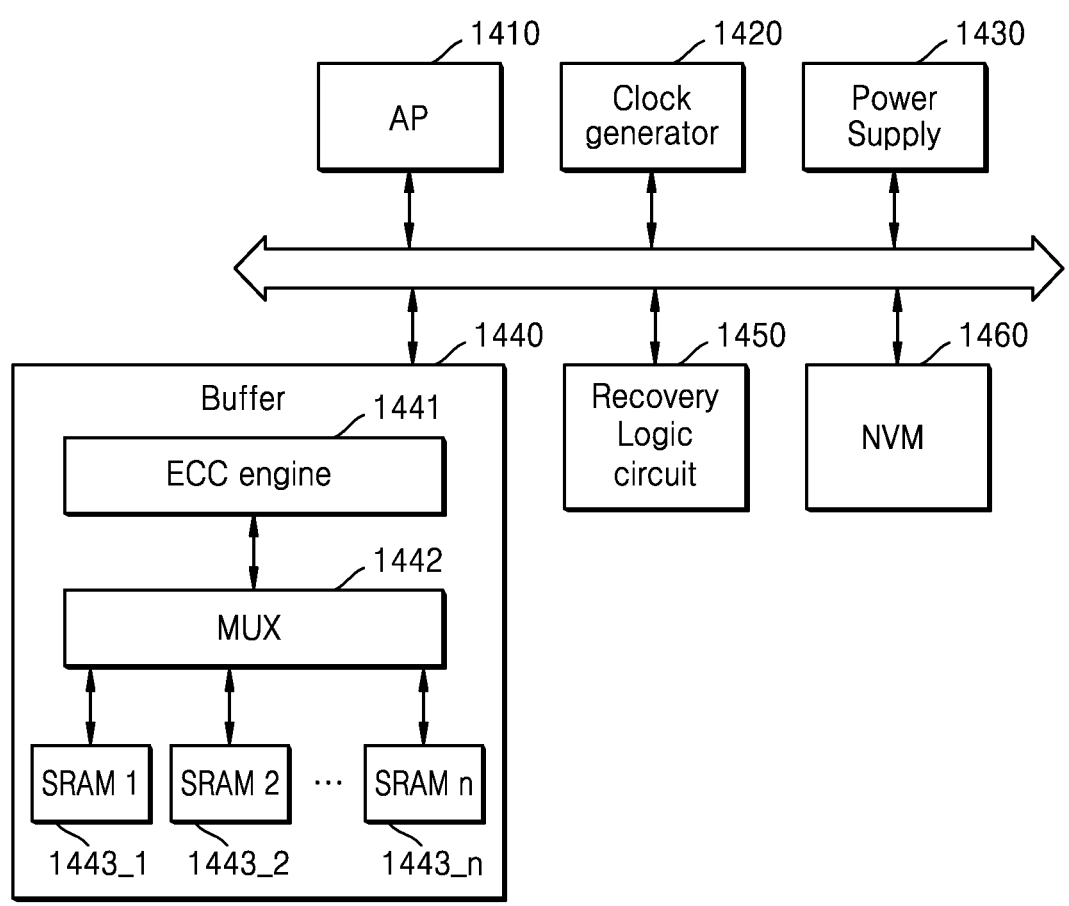
FIG. 13 is a view for explaining an electronic device according to another embodiment.

FIG. 13 is a view for explaining an electronic device according to an embodiment.

Referring to FIG. 13, an electronic device according to another embodiment may perform an operation of the electronic device illustrated in FIG. 1 or FIG. 12.

An electronic device according to an embodiment may include an application processor 1410, a clock generator 1420, a power supply 1430, a buffer 1440, a recovery logic circuit 1450, and a nonvolatile memory 1460. The application processor 1410, the clock generator 1420, the power supply 1430, the buffer 1440, the recovery logic circuit 1450, and the nonvolatile memory (NVM) 1460 may communicate with each other through a bus.

The application processor 1410 may control the clock generator 1420, the power supply 1430, the buffer 1440, the recovery logic circuit 1450, and the nonvolatile memory 1460. The application processor 1410 may perform an operation performed by the host 50 illustrated in FIG. 1. In an embodiment, the application processor 1410 may transmit a read command and an address to the buffer 1440. In this case, the address may correspond to a memory area provided in any one of the first to nth SRAMs 1443_1, 1443_2, ..., 1443_n. n may be an integer of 2 or more.

The clock generator 1420 may generate a clock for driving the buffer 1440. Also, the clock generator 1420 may generate a clock for driving the nonvolatile memory 1460.

The power supply 1430 may generate an internal voltage.

The buffer 1440 may correspond to the memory device 100 shown in FIG. 1 or the memory device 100' shown in FIG. 12. In an embodiment, the buffer 1440 may include an ECC engine 1441, a multiplexer (MUX) 1442, and first to n-th SRAMs 1443_1, 1443_2, ..., 1443_n. The ECC engine 1441 is the same as that described above with reference to FIGS. 1, 4, 5, 10, and 11A to 11C. The multiplexer 1442 may perform the same operation as that described above with reference to FIG. 12. The first to nth SRAMs 1443_1, 14432, ..., 1443_n may correspond to the plurality of volatile memories 110 described above with reference to FIG. 12. When the application processor 1410 transfers the read command and the address to the buffer 1440, among the first to n-th SRAMs 1443_1, 14432, ..., 1443_n, the SRAM having a memory area corresponding to an address (e.g., the first SRAM 1443_1) reads stored data in response to a read command, and output data. Data output from the SRAM (e.g., the first SRAM 1443_1) is transferred to the ECC engine 1441 through the multiplexer 1442. The ECC engine 1441 may correct an error in data output from the SRAM (e.g., the first SRAM 1443_1) and output the corrected data. The ECC engine 1441 may detect a 2-bit error in data output from the SRAM (e.g., the first SRAM 1443_1). In this case, the ECC engine 1441 may access the recovery logic circuit 1450 and check whether hint data corresponding to the SRAM (e.g., the first SRAM 1443_1) is stored in the recovery logic circuit 1450. When hint data corresponding to the SRAM (e.g., the first SRAM 1443_1) is stored in the recovery logic circuit 1450, the ECC engine 1441 may correct data having an error of 2 bits based on the hint data.

The recovery logic circuit 1450 may perform the operation as described above with reference to FIG. 1. When the ECC engine 1441 detects a 2-bit error in data output from the SRAM (e.g., the first SRAM 1443_1), the recovery logic circuit 1450 may generate hint data corresponding to the SRAM (e.g., the first SRAM 1443_1). For this, the recovery logic circuit 1450 may control the buffer 1440 to sequentially perform a write operation on the first test pattern data, a read operation on the first test data, a write operation on the second test pattern data, and a read operation on the second test data.

The nonvolatile memory 1460 may operate under the control of the application processor 1410. In particular, the nonvolatile memory 1460 may receive a command and an address from the application processor 1410, and may access a memory cell selected by an address among memory cells. The nonvolatile memory 1460 may perform an operation indicated by a command on a memory cell selected by an address. In one embodiment, the command may be a program command, a read command, or an erase command as an input/output command, an operation indicated by the command (or an operation corresponding to the command) may be, for example, a program operation (or write operation), a read operation, or an erase operation. As an example, the nonvolatile memory 1460 may be, for example, a flash memory. The flash memory may include, for example, a NAND flash memory, a NOR flash memory, or the like. When the nonvolatile memory 1460 includes flash memory, the flash memory may include a 2D NAND memory array or a 3D (or vertical) NAND (VNAND) memory array. However, embodiments are not limited thereto.

In an embodiment, when the electronic device is normally powered off, the application processor 1410 may control the recovery logic circuit 1450 and the nonvolatile memory 1460 to temporarily store the hint data in the nonvolatile memory 1460.

FIG. 14 is a diagram illustrating an error tendency generated according to an internal voltage and a frequency of a clock using a Shmoo condition.

In the electronic device according to embodiments, various internal voltages and frequencies of clocks may be generated. For example, the first to fifth internal voltages IV1, IV2, IV3, IV4, and IV5 may be selectively generated. The first to fifth clock frequencies CF1, CF2, CF3, CF4, and CF5 may be selectively generated. However, embodiments are not limited thereto. Hereinafter, for convenience, it is assumed that various internal voltages and clock frequencies are respectively the first to fifth internal voltages IV1, IV2, IV3, IV4, and IV5 and the first to fifth clock frequencies CF1, CF2, CF3, CF4, and CF5. In addition, it is assumed that the level of the (i+1)-th internal voltage (i is a natural number less than or equal to 4) is higher than the level of the i-th internal voltage. It is assumed that the (i+1)-th clock frequency is greater than the i-th clock frequency.

At the same clock frequency, as the internal voltage is higher, the probability of occurrence of a bad cell may be reduced. For example, a bad cell may occur at the first to fourth internal voltages IV1, IV2, IV3, and IV4 at the fifth clock frequency CF5 and the bad cell may not occur at the fifth internal voltage IV5. However, embodiments are not limited thereto. At the same internal voltage, as the clock frequency increases, the probability of occurrence of a bad cell may increase. For example, at the first internal voltage IV1, a defective cell may not be generated at the first clock frequency CF1, but may be generated from the second clock frequency CF2. However, embodiments are not limited thereto. In conclusion, as the clock frequency is lower and the internal voltage is higher, the probability of occurrence of a bad cell decreases.

FIG. 15 is a diagram for explaining an error phenomenon that may occur in an address of each segment.

Referring to FIG. 15 segments (k−1)th SEG, (k)th SEG, and (k+1)th SEG, where k is an integer greater than or equal to 2) may correspond to the plurality of volatile memories 110 illustrated in FIG. 12 or the first to n-th SRAMs 1443_1, 1443_2, ..., 1443_n illustrated in FIG. 13. Referring to FIGS. 13 and 15, for example, the (k−1)-th segment (k−1)th SEG may correspond to the first SRAM 1443_1, the k-th segment (k)th SEG may correspond to the second SRAM 14432, and the (k+1)-th segment (k+1)th SEG may correspond to the third SRAM. For consecutive segments (k−1)th SEG, (k)th SEG, and (k+1)th SEG, the value of the address may be consecutive.

The user writes test data (e.g., data having a value of "Fh") into segments (k−1)th SEG, (k)th SEG, and (k+1)th SEG, cells may be checked. For an error of 2 bits, bit flips continuously occur in a particular column of one segment, but this error does not affect other segments. For example, it is assumed that bit flips continuously occur in a column corresponding to address 0 of the k-th segment (k)th SEG. In this case, an error occurring in the k-th segment (k)th SEG does not affect the (k−1)-th segment (k−1)th SEG and the (k+1)-th segment (k+1)th SEG.

FIG. 16 is a diagram for explaining hint data according to an embodiment.

Referring to FIG. 16, hint data according to an embodiment may be generated and stored for each of the plurality of volatile memories 110 shown in FIG. 12, the first to n-th SRAMs 1443_1, 1443_2, ..., 1443_n shown in FIG. 13, or the segments (e.g., (k−1)th SEG, (k)th SEG, and (k+1)th SEG) shown in FIG. 15. Referring to FIGS. 13 and 16, for example, the first hint data may be hint data for the (k−1)-th segment (k−1)th SEG, and the (k−1)-th segment (k−1)th SEG may correspond to the first SRAM 1443_1. In addition, the second hint data may be hint data for the k-th segment (k)th SEG, and the k-th segment (k)th SEG may correspond to the second SRAM 14432. And, the third hint data is hint data for the (k+1)-th segment (k+1)th SEG, and the (k+1)-th segment (k+1)th SEG may correspond to the third SRAM. However, embodiments are not limited thereto. Hereinafter, it is assumed that the first hint data is hint data for the first SRAM 1443_1, the second hint data is hint data for the second SRAM 1443_2, and the third hint data is hint data for the third SRAM.

The value of the first hint data may be the second value. This is that the first SRAM 1443_1 includes only normal cells, and a 2-bit error may not occur in the first SRAM 1443_1.

When a bad cell occurs in the 6th bit line and the 71st bit line of the second SRAM 1443_2, respectively, the value of the second hint data for the 6th bit line and the 71st bit line may be "1b", and the value of the hint data for the remaining bit lines may be "0b".

When a bad cell occurs in the second bit line of the third SRAM and one bit line (e.g., the third bit line) among the remaining bit lines, respectively, the value of the third hint data for the second bit line or the value of the third hint data for the one bit line (e.g., the third bit line) may be "1b". For example, the value of the third hint data for the second bit line may be "1b", and the value of the hint data for the remaining bit lines may be "0b".

Figure 17:
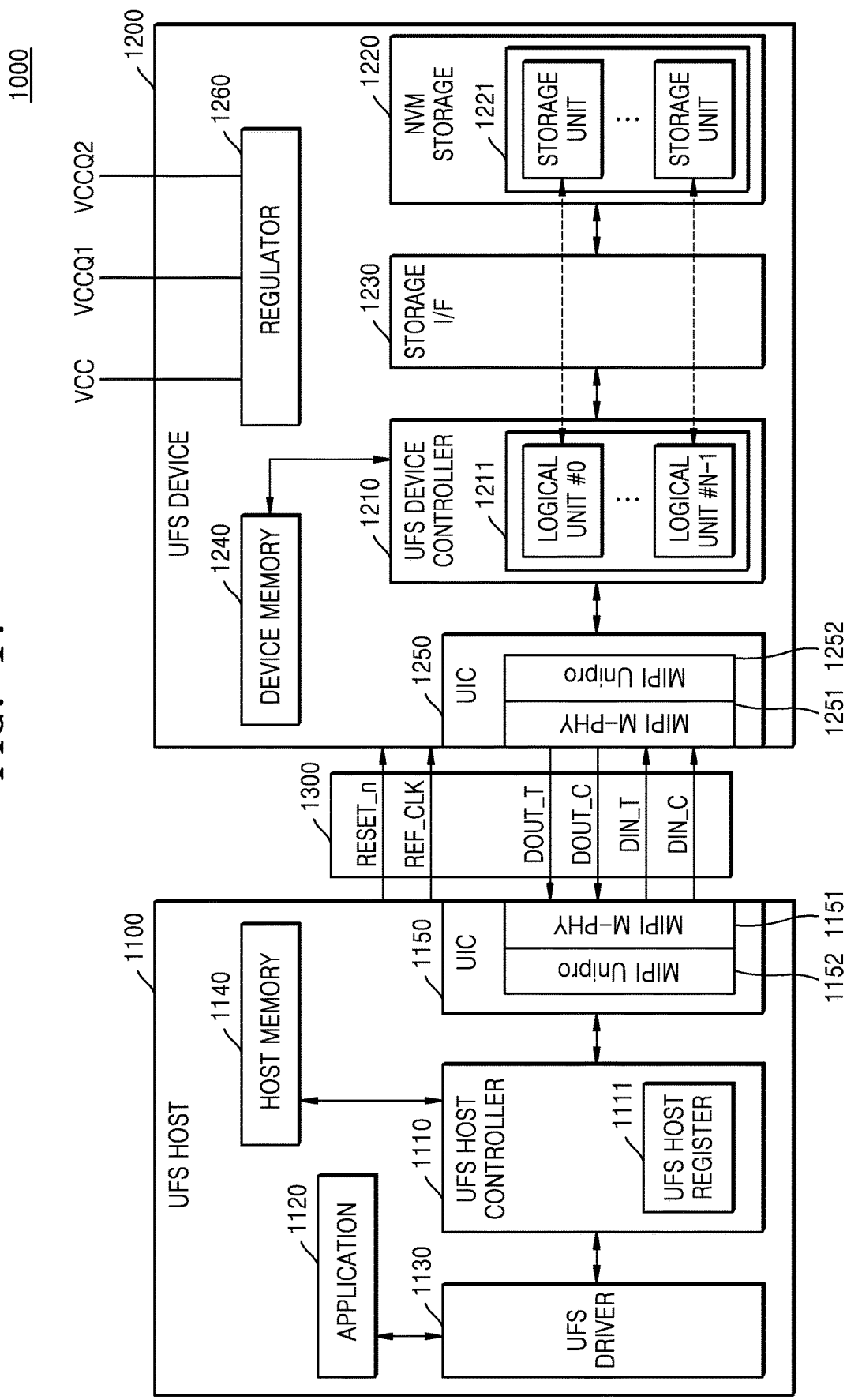
FIG. 17 is a diagram for explaining a Universal Flash Storage (UFS) system according to an embodiment.

FIG. 17 is a diagram for explaining a Universal Flash Storage (UFS) system according to an embodiment.

Referring to FIG. 17, the UFS system 1000 may be a system conforming to the UFS standard published by the Joint Electron Device Engineering Council (JEDEC). The UFS system 1000 may include a UFS host 1100, a UFS device 1200, and a UFS interface 1300.

The UFS host 1100 and the UFS device 1200 may be interconnected through the UFS interface 1300. When the host 50 of FIG. 1 is an AP, the UFS host 1100 may be implemented as a part of the corresponding AP.

The UFS host 1100 may include a UFS host controller 1110, an application 1120, a UFS driver 1130, a host memory 1140, and a UFS interconnect (UIC) layer 1150. The UFS device 1200 may include a UFS device controller 1210, a nonvolatile storage (i.e., memory) 1220, a storage interface (I/F) 1230, a device memory 1240, a UIC layer 1250, and a regulator 1260. The nonvolatile memory 1220 may be composed of a plurality of memory units 1221, and each of the memory units 1221 may include a V-NAND flash memory having a 2D structure or a 3D structure, but may include other types of nonvolatile memory such as PRAM and/or RRAM. The UFS device controller 1210 and the nonvolatile memory 1220 may be connected to each other through the storage interface 1230. The storage interface 1230 may be implemented to comply with a standard protocol such as toggle or ONFI. The device memory 1240 may correspond to the memory device 100 illustrated in FIG. 1.

The application 1120 may mean a program that wants to communicate with the UFS device 1200 to use the function of the UFS device 1200. The application 1120 may transmit an input-output request to the UFS driver 1130 for input/output to the UFS device 1200. The input-output request may be a read request, a write request, and/or a discard request of data, but is not necessarily limited thereto.

The UFS driver 1130 may manage the UFS host controller 1110 through a UFS-host controller interface (HCI). The UFS driver 1130 may convert the input-output request generated by the application 1120 into a UFS command defined by the UFS standard, and transmit the converted UFS command to the UFS host controller 1110. One input-output request may be converted into multiple UFS commands. A UFS command may be basically a command defined by the SCSI standard, but it may also be a command dedicated to the UFS standard.

The UFS host controller 1110 may transmit the UFS command converted by the UFS driver 1130 to the UIC layer 1250 of the UFS device 1200 through the UIC layer 1150 and the UFS interface 1300. In this process, the UFS host register 1111 of the UFS host controller 1110 may serve as a command queue (CQ).

The UIC layer 1150 of the UFS host 1100 side may include a MIPI M-PHY 1151 and a MIPI UniPro 1152, and the UIC layer 1250 of the UFS device 1200 side may also include a MIPI M-PHY 1251 and a MIPI UniPro 1252.

The UFS interface 1300 may include a line for transmitting the reference clock REF_CLK, a line for transmitting a hardware reset signal RESET_n for the UFS device 1200, a pair of lines for carrying a differential input signal pair DIN_T and DIN_C, and a pair of lines for transmitting the differential output signal pair DOUT_T and DOUT_C.

The frequency value of the reference clock provided from the UFS host 1100 to the UFS device 1200 may be one of four values of 19.2 MHz, 26 MHz, 38.4 MHz, and 52 MHz, but is not limited thereto. The UFS host 1100 may change the frequency value of the reference clock during operation, that is, while data transmission/reception is performed between the UFS host 1100 and the UFS device 1200. The UFS device 1200 may generate clocks of various frequencies from the reference clock provided from the UFS host 1100 using a phase-locked loop (PLL) or the like. Also, the UFS host 1100 may set a data rate value between the UFS host 1100 and the UFS device 1200 through the frequency value of the reference clock. That is, the value of the data rate may be determined depending on the frequency value of the reference clock.

The UFS interface 1300 may support a plurality of lanes, and each lane may be implemented as a differential pair. For example, the UFS interface may include one or more receive lanes and one or more transmit lanes. A pair of lines that transmit differential input signal pairs DIN_T and DIN_C may constitute a receive lane. A pair of lines transmitting the differential output signal pair DOUT_T and DOUT_C may constitute a transmit lane. Although one transmit lane and one receive lane are illustrated in FIG. 17, the number of transmit lanes and receive lanes may be changed.

The receive lane and transmit lane may transmit data in a serial communication method, and full-duplex communication between the UFS host 1100 and the UFS device 1200 is possible by a structure in which the receive lane and the transmit lane are separated. That is, the UFS device 1200 may transmit data to the UFS host 1100 through the transmit lane while receiving data from the UFS host 1100 through the receive lane. In addition, control data such as commands from the UFS host 1100 to the UFS device 1200, and user data that the UFS host 1100 intends to store in or read from the nonvolatile memory 1220 of the UFS device 1200 may be transmitted through the same lane. Accordingly, there is no need to further provide a separate lane for data transmission between the UFS host 1100 and the UFS device 1200 in addition to the pair of receive lanes and the pair of transmit lanes.

The UFS device controller 1210 of the UFS device 1200 may control overall operation of the UFS device 1200. The UFS device controller 1210 may manage the nonvolatile memory 1220 through a logical unit (LU) 1211 (The 0th logical unit to the N−1th logical unit) which is a logical data storage unit. The number of LUs 1211 may be 8, but is not limited thereto. The UFS device controller 1210 may include a flash translation layer (FTL), and may convert a logical data address, for example, a logical block address (LBA) transmitted from the UFS host 1100, into a physical data address, for example, a physical block address (PBA) using the address mapping information of FTL. A logical block for storing user data in the UFS system 1000 may have a size within a preset range. For example, the minimum size of the logical block may be set to 4 Kbytes.

When a command from the UFS host 1100 is input to the UFS device 1200 through the UIC layer 1250, the UFS device controller 1210 may perform an operation according to the input command, and transmit a completion response to the UFS host 1100 when the operation is completed.

As an example, when the UFS host 1100 intends to store user data in the UFS device 1200, the UFS host 1100 may transmit a data storage command to the UFS device 1200. Upon receiving a response indicating that user data is ready-to-transfer from the UFS device 1200, the UFS host 1100 may transmit user data to the UFS device 1200. The UFS device controller 1210 temporarily may store the received user data in the device memory 1240, and store the user data temporarily stored in the device memory 1240 in the selected location of the nonvolatile memory 1220 based on the address mapping information of the FTL.

As another example, when the UFS host 1100 wants to read user data stored in the UFS device 1200, the UFS host 1100 may transmit a data read command to the UFS device 1200. The UFS device controller 1210 that receives the command may read user data from the nonvolatile memory 1220 and temporarily store the read user data in the device memory 1240 based on the data read command. In this reading process, the UFS device controller 1210 may detect and correct errors in the read user data using a built-in error correction code (ECC) engine. In particular, the ECC engine may generate parity bits for input data to be written to the nonvolatile memory 1220, and the generated parity bits may be stored in the nonvolatile memory 1220 together with the input data. When reading data from the nonvolatile memory 1220, the ECC engine may correct an error in the read data and output the error-corrected read data using the parity bits read from the nonvolatile memory 1220 together with the read data.

In addition, the UFS device controller 1210 may transmit user data temporarily stored in the device memory 1240 to the UFS host 1100. In addition, the UFS device controller 1210 may further include an advanced encryption standard (AES) engine. The AES engine may perform at least one of an encryption operation and a decryption operation on data input to the UFS device controller 1210 using a symmetric-key algorithm.

The UFS host 1100 may sequentially store commands to be transmitted to the UFS device 1200 in the UFS host register 1111, which may be used to form a command queue, and may transmit the commands to the UFS device 1200 in this order. At this time, even if a previously transmitted command is still being processed by the UFS device 1200, that is, even before notified by the UFS device 1200 that processing of a previously transmitted command has been completed, the UFS host 1100 may transmit the next command waiting in the command queue to the UFS device 1200, and accordingly, the UFS device 1200 may also receive the next command from the UFS host 1100 while processing the previously transmitted command. The maximum number of commands (queue depth) that may be stored in such a command queue may be, for example, 32. In addition, the command queue may be implemented as a circular queue type indicating the start and end of the command sequence stored in the queue, respectively, through a head pointer and a tail pointer.

Each of the plurality of memory units 1221 may include a memory cell array and a control circuit for controlling an operation of the memory cell array. The memory cell array may include a two-dimensional memory cell array or a three-dimensional memory cell array. The memory cell array includes a plurality of memory cells, and each memory cell may be a single level cell (SLC) that stores one bit of information, but may be a cell that stores information of two or more bits, such as a multi-level cell (MLC), a triple level cell (TLC), or a quadruple level cell (QLC). The three-dimensional memory cell array may include vertical NAND strings that are vertically oriented such that at least one memory cell is positioned on top of another memory cell.

VCC, VCCQ, VCCQ2, and the like may be input to the UFS device 1200 as a power supply voltage. VCC is a main power supply voltage for the UFS device 1200 and may have a value of about 2.4 V to about 3.6V. VCCQ is a power supply voltage for supplying a low-range voltage, and is mainly for the UFS device controller 1210, and may have a value of about 1.14 V to about 1.26 V. VCCQ2 is a power supply voltage to supply a lower voltage than VCC but higher than VCCQ, and is mainly for an input/output interface such as the MIPI M-PHY 1251, and may have a value of about 1.7 V to about 1.95 V. The power supply voltages may be supplied for each component of the UFS device 1200 through the regulator 1260. The regulator 1260 may be implemented as a set of unit regulators respectively connected to different ones of the aforementioned power supply voltages.

While aspects of embodiments have been particularly shown and described, it will be understood that various changes in form and details may be made therein without departing from the spirit and scope of the following claims.

What is claimed is:
1. A memory device comprising:
a volatile memory comprising a plurality of memory cells, a plurality of word lines and a plurality of bit lines, and configured to provide output data stored in target memory cells, among the plurality of memory cells, based on a first read command and an address received from a host;
a recovery logic circuit configured to provide hint data indicating first bit lines to which defective cells are connected, and second bit lines to which other cells are connected, among the plurality of bit lines;

an Error Correction Circuit (ECC) configured to generate corrected data by correcting an error in the output data based on the output data and the hint data, and to provide the corrected data to the host; and a recovery controller configured to control the volatile memory to store first test pattern data in the target memory cells, control the volatile memory to read first test data from the target memory cells, control the volatile memory to store second test pattern data in the target memory cells, control the volatile memory to read second test data from the target memory cells, and generate the hint data based on the first test data and the second test data.

2. The memory device of claim 1, wherein the recovery logic circuit comprises:

a hint data buffer configured to temporarily store the hint data; and a test data buffer configured to temporarily store test data.

3. The memory device of claim 2, wherein the recovery controller is further configured to:

transfer a first write command, the first test pattern data, and the address to the volatile memory;

transfer a second read command and the address to the volatile memory;

store the first test data output from the volatile memory in the test data buffer;

transfer a second write command, the second test pattern data, and the address to the volatile memory;

transfer a third read command and the address to the volatile memory; and store the second test data output from the volatile memory in the test data buffer.

4. The memory device of claim 3, wherein the recovery controller is further configured to:

perform an XOR operation on the first test data and the second test data; and store first result data, at least one bit of the first result data having a first value, according to a result of the XOR operation as the hint data in the hint data buffer.

5. The memory device of claim 4, wherein the recovery controller is further configured to:

transmit a setting request signal to change any one or any combination of an internal voltage and a clock frequency for operating the volatile memory to the host based on all values of second result data generated by the XOR operation being a second value different from the first value; and control the volatile memory to perform a write operation based on the first test pattern data, a read operation based on the first test data, a write operation based on the second test pattern data, and a read operation based on the second test data, based on any one or any combination of the internal voltage and the clock frequency being changed according to the setting request signal.

6. The memory device of claim 5, wherein the recovery controller is further configured to request the host to generate a reduced internal voltage having a level lower than the internal voltage based on all values of the second result data being the second value.

7. The memory device of claim 5, wherein the recovery controller is further configured to request the host to generate a clock having an increased clock frequency, greater than the clock frequency, based on all values of the second result data being the second value.

8. The memory device of claim 2, wherein the recovery controller is further configured to:

back up output data to the test data buffer and control the volatile memory to store test pattern data in the target memory cells; and control the volatile memory to store the backed-up output data in the target memory cells after the hint data is generated.

9. The memory device of claim 1, wherein the ECC is further configured to:

generate a parity bit with respect to data received from the host;

correct the output data using the hint data;

transmit the corrected data to the host;

output data in which at least one error bit is corrected by performing an XOR operation on the output data and the hint data;

generate syndrome data based on the data in which the at least one error bit is corrected;

calculate coefficients of an error location equation based on a reciprocal of a position of an error bit based on the syndrome data;

calculate a position of the error bit in the data in which the at least one error bit is corrected by using the syndrome data and the coefficients of the error location equation;

correct the error by inverting a value of the error bit; and output the corrected data.

10. An electronic device comprising:

an application processor configured to output a first read command and an address;

a buffer comprising a plurality of volatile memories, a multiplexer configured to select a volatile memory corresponding to the address from among the plurality of volatile memories, and an Error Correction Circuit (ECC) configured to correct an error occurring in output data read from the volatile memory through a read operation performed according to the first read command; and a recovery logic circuit configured to provide hint data indicating first bit lines to which bad cells are respectively connected and second bit lines to which other cells are connected, wherein the ECC is further configured to correct the error based on first hint data corresponding to the selected volatile memory and the output data, and provide corrected data to the application processor, and wherein the recovery logic circuit comprises a recovery controller configured to control the selected volatile memory to store first test pattern data, control the selected volatile memory to read first test data, control the selected volatile memory to store second test pattern data, control the selected volatile memory to read second test data, and generate the hint data based on the first test data and the second test data provided from the selected volatile memory.

11. The electronic device of claim 10, wherein the recovery logic circuit comprises:

a hint data buffer configured to temporarily store the first hint data; and a test data buffer configured to temporarily store test data.

12. The electronic device of claim 11, wherein the recovery controller is further configured to:

transfer a first write command, the first test pattern data, and the address to the selected volatile memory;

transfer a second read command and the address to the selected volatile memory;

store the first test data output from the selected volatile memory in the test data buffer;
transfer a second write command, the second test pattern data, and the address to the selected volatile memory;
transfer a third read command and the address to the selected volatile memory; and
store the second test data output from the selected volatile memory in the test data buffer.

13. The electronic device of claim 12, wherein the recovery controller is further configured to:
perform an XOR operation on the first test data and the second test data; and
store first result data having at least one first value according to a result of the XOR operation as the hint data in the hint data buffer.

14. The electronic device of claim 13, further comprising a power supply configured to provide an internal voltage,
wherein the application processor is further configured to control the power supply, based on a setting request signal, to reduce a level of the internal voltage, and
wherein the recovery controller is further configured to:
transmit the setting request signal to the application processor based on all values of second result data generated by the XOR operation being a second value different from the at least one first value; and
control the selected volatile memory to perform a write operation based on the first test pattern data, a read operation based on the first test data, a write operation based on the second test pattern data, and a read operation based on the second test data, based on the level of the internal voltage being changed.

15. The electronic device of claim 13, further comprising a clock generator configured to provide a clock,
wherein the application processor is further configured to control the clock generator, based on a setting request signal, to increase a clock frequency of the clock, and
wherein the recovery controller is further configured to:
transmit the setting request signal to the application processor based on all values of second result data generated by the XOR operation being a second value different from the at least one first value; and
control the selected volatile memory to perform a write operation based on the first test pattern data, a read operation based on the first test data, a write operation based on the second test pattern data, and a read operation based on the second test data, based on the clock frequency being changed.

16. The electronic device of claim 11, wherein the recovery controller is further configured to:
control the selected volatile memory to store test pattern data after backing up output data to the test data buffer; and
control the selected volatile memory to store the output data stored in the test data buffer in target memory cells after the hint data is generated.

17. The electronic device of claim 10, wherein the ECC is further configured to:
generate a parity bit with respect to data received from the application processor;
correct the output data using the first hint data;
transmit the corrected data to the application processor;
output data in which at least one error bit is corrected by performing an XOR operation on the output data and the first hint data;
generate syndrome data based on the data in which the at least one error bit is corrected;

calculate coefficients of an error location equation based on a reciprocal of a position of an error bit based on the syndrome data;
calculate a position of the error bit in the data in which the at least one error bit is corrected by using the syndrome data and the coefficients of the error location equation;
correct the error by inverting a value of the error bit based on the position; and
output the corrected data.

18. A method of operating a memory device including a plurality of volatile memories, the method comprising:
storing first test pattern data in a volatile memory among the plurality of volatile memories;
control the volatile memory to read first test data from the volatile memory;
control the volatile memory to store second test pattern data in the volatile memory;
control the volatile memory to read second test data from the volatile memory;
generate hint data based on the first test data and the second test data;
receiving a read command and an address indicating the volatile memory from a host;
reading data stored in the volatile memory;
detecting a 2-bit error in the data read from the volatile memory;
correcting the 2-bit error based on the hint data and the data read from the volatile memory to obtain corrected data; and
providing the corrected data to the host.

19. The method of claim 18, further comprising:
backing up the data read from the volatile memory after the 2-bit error is detected;
transferring the first test pattern data, a first write command, and the address to the volatile memory to store the first test pattern data in the volatile memory;
transferring a second read command and the address to the volatile memory to acquire the first test data from the volatile memory;
transferring the second test pattern data, a second write command, and the address to the volatile memory to store the second test pattern data in the volatile memory;
transferring a third read command and the address to the volatile memory to acquire the second test data from the volatile memory;
generating result data by performing an XOR operation on the first test data and the second test data; and
generating the hint data according to a value of the result data.

20. The method of claim 19, wherein the correcting of the 2-bit error comprises:
outputting data in which at least one error bit is corrected by performing the XOR operation on the data read from the volatile memory and the hint data;
generating syndrome data based on the data in which the at least one error bit is corrected;
calculating coefficients of an error location equation based on a reciprocal of a position of an error bit based on the syndrome data;
calculating a position of the error bit in the data in which the at least one error bit is corrected by using the syndrome data and the coefficients of the error location equation;
correcting an error by inverting a value of the error bit based on the position; and
outputting the corrected data.

* * * * *